(12) United States Patent  
Aberg

(10) Patent No.: US 10,360,310 B2  
(45) Date of Patent: Jul. 23, 2019

(54) SELF-TESTING GRAPHICAL COMPONENT ALGORITHM SPECIFICATION

(71) Applicant: The MathWorks, Inc., Natick, MA (US)

(72) Inventor: Robert O. Aberg, South Grafton, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 13/838,344

(22) Filed: Mar. 15, 2013

(65) Prior Publication Data

US 2014/0122028 A1  May 1, 2014

Related U.S. Application Data

(63) Continuation-in-part of application No. 13/662,529, filed on Oct. 28, 2012.

(51) Int. Cl.
*G06F 8/35* (2018.01)
*G06F 11/36* (2006.01)
*G06F 17/50* (2006.01)

(52) U.S. Cl.
CPC .............. *G06F 17/50* (2013.01); *G06F 8/355* (2013.01); *G06F 11/368* (2013.01); *G06F 11/3684* (2013.01)

(58) Field of Classification Search
None
See application file for complete search history.

(56) References Cited

U.S. PATENT DOCUMENTS

| | | | |
|---|---|---|---|
| 7,324,931 B1 | 1/2008 | Warlock | |
| 7,991,598 B1 | 8/2011 | Wood | |
| 2008/0028364 A1* | 1/2008 | Triou et al. | 717/104 |
| 2010/0131917 A1* | 5/2010 | Iwamasa | 717/104 |
| 2011/0138353 A1* | 6/2011 | Niere et al. | 717/104 |

(Continued)

FOREIGN PATENT DOCUMENTS

| | | |
|---|---|---|
| JP | 09-251474 A | 9/1997 |
| JP | 2006-178775 A | 7/2006 |

(Continued)

OTHER PUBLICATIONS

Wikipedia, Atomicity. Version from Sep. 11, 2012. http://en.wikipedia.org/w/index.php?title=Atomicity_(database_systems)&oldid=511843063.*

(Continued)

*Primary Examiner* — Bijan Mapar
(74) *Attorney, Agent, or Firm* — Cesari and McKenna, LLP; Michael R. Reinemann

(57) ABSTRACT

A system and method automatically ensures consistency among a design model, an interface specification and one or more tests that test the design model. The system may include a broker adapted to construct the interface specification. The interface specification identifies the interface of the design model, e.g., its external inputs, external outputs, and initialization settings. It may also identify the outputs, inputs, and initialization setting objects of the tests. Proposed changes to any one of the design model's interface, the interface specification and the interfaces of the tests may be captured by the broker, and applied to the other two.

23 Claims, 31 Drawing Sheets

(56) References Cited

U.S. PATENT DOCUMENTS

2012/0124552 A1* 5/2012 Lin et al. ............... 717/107
2013/0074040 A1* 3/2013 Peranandam et al. ........ 717/124

FOREIGN PATENT DOCUMENTS

WO    WO 2008/066925    6/2008
WO    WO-2008/066925 A2    6/2008

OTHER PUBLICATIONS

Writing S-Functions in C. Version from Jul. 9, 2009. https://web.archive.org/web/20090709091209/http://www-rohan.sdsu.edu/doc/matlab/toolbox/simulink/sfg/sfunc_c12.html.*

Iyenghar, Padma, Elke Pulvermueller, and Clemens Westerkamp. "Towards model-based test automation for embedded systems using UML and UTP." Emerging Technologies & Factory Automation (ETFA), 2011 IEEE 16th Conference on. IEEE, 2011.*

Tarhini, Abbas, Hacène Fouchal, and Nashat Mansour. "Regression Testing Web Services-based Applications." AICCSA 6 (2006): 163-170.*

Han, Li, et al., "Object-Oriented Libraries of Physical Components in Simulation and Design," Institute for Complex Engineered Systems and Department of Electrical and Computer Engineering, Carnegie Mellon University, Pittsburgh, PA, May 2001, pp. 1-8.

Akour, Mohammed, et al., "Towards Change Propagating Test Models in Autonomic and Adaptive Systems," 18$^{th}$ IEEE International Conference and Workshops On, IEEE, Apr. 27, 2011, pp. 89-96.

"Invitation to Pay Additional Fees and, Where Applicable, Protest Fee," International Filing Date: Oct. 24, 2013, International Application No. PCT/US2013/066537, Applicant: The MathWorks, Inc., dated Jan. 21, 2014, pp. 1-7.

Sandmann, Guido et al., "AUTOSAR-Compliant Development Workflows: From Architecture to Implementation—Tool Interoperability for Round-Trip Engineering and Verification & Validation," SAE Technical Papers, The MathWorks, Inc., Jan. 1, 2012, pp. 1-8.

Siegl, Sebastian, et al., "Automated Testing of Embedded Automotive Systems from Requirement Specification Models," Test Workshop (LATW), 12$^{th}$ Latin American, IEEE, Mar. 27, 2011, pp. 1-6.

Guido Sandmann et al: "AUTOSAR-compliant development workflows: From architecture to implementation—tool interoperability for round-trip engineering and verification and validation", SAE Technical Papers, Jan. 1, 2012, Retrieved from the Internet: URL:http://www.mathworks.com/tagteam/72346_SAE_2012_AUTOSAR_RoundTrip.pdf, pp. 1-8.

Sebastian Siegl et al: "Automated testing of embedded automotive systems from requirement specification models", Test Workshop (LATW), 2011 12$^{th}$ Latin American, IEEE, Mar. 27, 2011, pp. 1-6.

Mohammed Akour et al: "Towards Change Propagating Test Models in Autonomic and Adaptive Systems", Engineering of Computer Based Systems (ECBS), 2011 18$^{th}$ IEEE International Conference and Workshops on, IEEE, Apr. 27, 2011, pp. 89-96.

Notification of Transmittal of the International Search Report and the Written Opinion of the International Searching Authority, or the Declaration dated Sep. 22, 2014.

Erkkinen and Conrad, "Verification, Validation, and Test with Model-Based Design", Copyright 2008 The MathWorks, Inc.

S. Popinchalk, "Guy and Seth on Simulink—Bus Objects and Interface Specifications" (Apr. 18, 2008).

"Software and Processor-in-the-Loop (SIL and PIL) Simulation" (copr. 2007-2009 The MathWorks, Inc.).

Morse and Anderson, "Introducing Application Design and Software Engineering Principles in Introductors CS Courses: Model-View-Controller Java Application Framework", Copyright 2004 by the Consortium for Computing Sciences in Colleges, pp. 190-201.

Burbeck, Applications Programming in Smalltalk-80™: How to use Model-View-Controller (MVC), Copyright 1987, 1992, pp. 1-11.

"Model-view-Controller," Wikipedia, Version dated Sep. 21, 2012.

Software and Processor-in-the-Loop (SIL and PIL) Simulation, published by The Mathworks, Inc., retrieved on Feb. 23, 2012, 8 pages.

Popinchalk, Seth et al., "Guy and Seth on Simulink: Bus Objects and Interface Specifications", published by The Mathworks, Inc., retrieved on Feb. 22, 2012, 7 pages.

Erkkinen, Tom et al., "Verification, Validation, and Test with Model-Based Design", published by The Mathworks, Inc., Apr. 2008, 6 pages.

Morse, Scot F. et al., Introducing Application Design and Software Engineering Principles in Introductory CS Courses: Model-View-Controller Java Application Framework, published by Consortium for Computing Sciences in Colleges, 2004, pp. 190-201.

Burbeck, Steve. Applications Programming in Smalltalk-80(TM): How to use Model-View-Controller (MVC), 1992, 11 pages.

"Simulink®: User's Guide: R2011b,"The MathWorks, Inc., Sep. 2011, pp. 1-2116.

* cited by examiner

| Interface Specification | | | | | | |
|---|---|---|---|---|---|---|
| Design Model — 412 | — 414 | — 416 | — 418 | — 420 | | |
| External Inputs — 402 | Data Type | Numeric Type | Data Dimension | Sampling Mode | | |
| Name | | | | | | |
| In1 | Single | Real | Vector | Frame | | |
| In2 | Double | Complex | Array | Sampling | | |
| External Outputs — 422 | — 424 | — 426 | — 428 | — 430 | Test Model1 — 456 | Test Model2 — 458 |
| Name | Data Type | Numeric Type | Data Dimension | Sampling Mode | External Outputs — 460 | External Outputs |
| Out1 | Single | Real | Array | Sampling | Name | Name |
| Out2 | Fixed Point | Real | Vector | | Out1 | Out1 |
| Out3 | Boolean | Real | Scalar | Sampling | Out2 | Out2 |
| Initialization States — 432 | — 434 | — 436 | — 438 | | External Inputs — 462 | External Inputs — 472 |
| Name | Data Type | Numeric Type | Data Dimension | | Name | Name |
| State2 | | | | | In1 | In1 |
| | | | | | In2 | In2 |
| Data Store Memory Read1 | | | | | In3 | In3 |
| | | | | — 464 | — 474 | |
| | | | | | Name | Name |
| | | | | | Data Store Memory Write1 | Data Store Memory Write1 |

| Interface Specification | | | | | | | |
|---|---|---|---|---|---|---|---|
| Design Model | | | | | Test Model 1 | | Test Model 2 |
| *Parameter* 440 | Data Type 442 | Numeric Type 444 | Data Dimension 446 | | 466 Name | | 476 Name |
| Name | | | | | | | |
| ModelParameter0 | | | | | | | |
| BlockParameter1 | | | | | | | |
| *Control Signals* 448 | Data Type 450 | Numeric Type 452 | Data Dimension 454 | | 468 Name | | 478 Name |
| Name | | | | | | | |
| Enable1 | | | | | | | |
| Trigger0 | | | | | | | |

408 braces rows for Parameter section; 410 braces rows for Control Signals section.

| | | | | INTERFACE SPECIFICATION | | | | Interface/Element/Attributes | | | |
|---|---|---|---|---|---|---|---|---|---|---|---|
| | Design Model | Interface/Element Name) Test Model 1 | Test Program 1 | Test Data 1 | Data Type | Data Dimension | Complexity | Sampling Mode | Read/Write Range | | Default Condition |
| Design Inputs 2034 | FromMotor | ToShaft | Out1 | Out1 | | | | | | | |
| | | | | | | | | | | | |
| Design Outputs 2036 | ToClutch | FromShaft | In1 | In2 | | | | | | | |
| | | | | | | | | | | | |
| Initialization Settings  States | | | | | | | | | | | |
| | | | | | | | | | | | |
| Signals | | | | | | | | | | | |
| | | | | | | | | | | | |
| Design Settings/ Parameters | | | | | | | | | | | |
| | | | | | | | | | | | |
| Design Control Signals | | | | | | | | | | | |

SELF-TESTING GRAPHICAL COMPONENT ALGORITHM SPECIFICATION

CROSS-REFERENCE TO RELATED APPLICATIONS

The present application is a continuation-in-part of commonly assigned, copending U.S. patent application Ser. No. 13/662,529, filed Oct. 28, 2012, by Robert O. Aberg, Andrew C. Grace and Peter S. Szpak for Self-Testing Graphical Component Algorithm Specification, which application is hereby incorporated by reference in its entirety.

BRIEF DESCRIPTION OF THE DRAWINGS

The invention description below refers to the accompanying drawings, of which:

FIGS. 4A-B are an illustration of an interface specification in accordance with an embodiment of the present invention;

FIG. 20 is an illustration of an interface specification in accordance with an embodiment of the present invention;

DETAILED DESCRIPTION OF AN ILLUSTRATIVE EMBODIMENT

Figure 1:
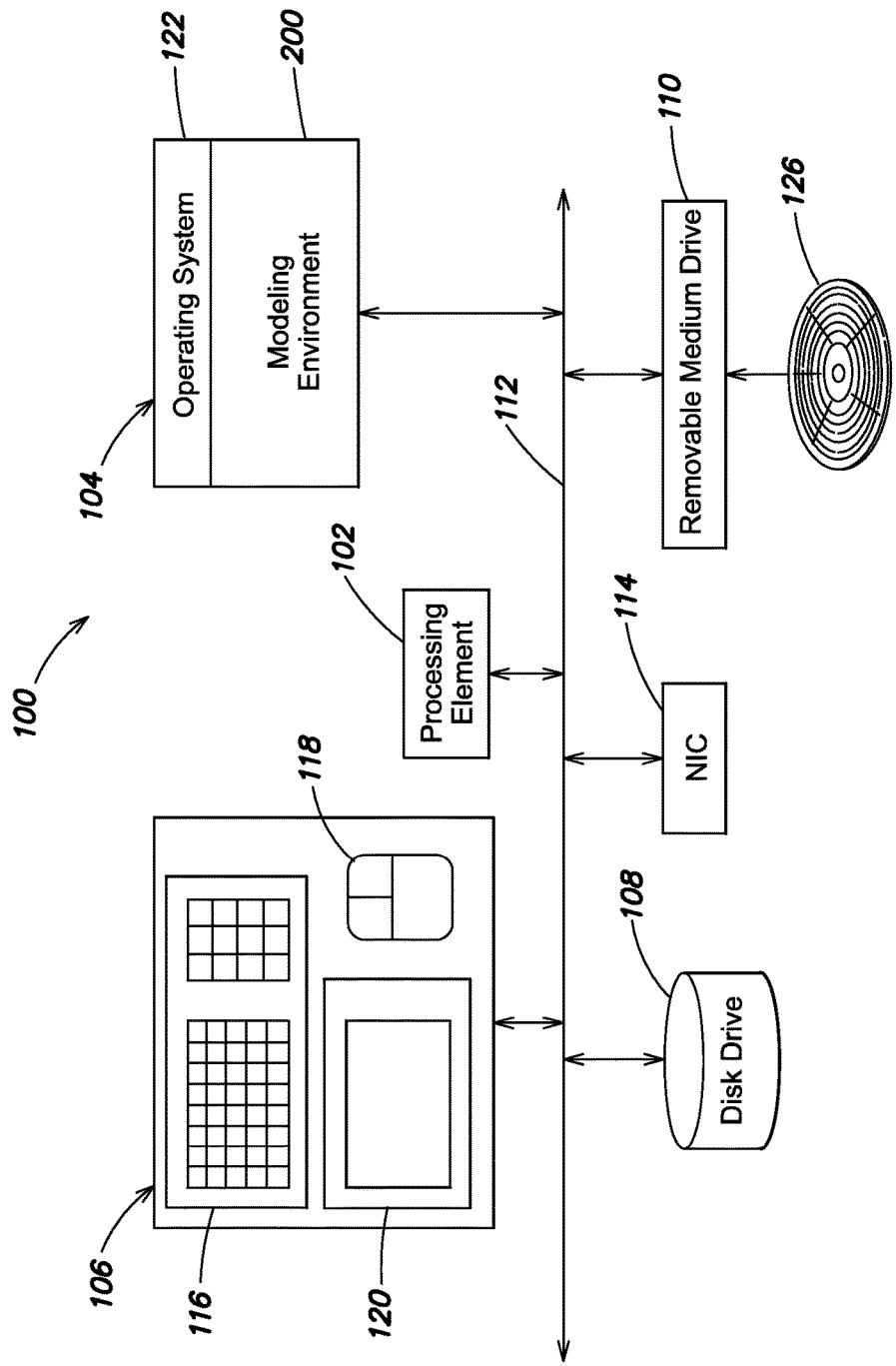
FIG. 1 is a schematic block diagram of a data processing system suitable for use with the present invention.

In an embodiment, the present invention relates to systems and methods for automatically ensuring consistency among a design model, an interface specification and one or more tests created to test the design model. The design model may have an interface comprising one or more external inputs, one or more external outputs, one or more initialization settings, and one or more parameters. During execution, the design model receives data at its inputs, processes that data based on the initialization settings and parameters, computes results, and presents the computed results at its outputs. The one or more tests may include outputs and inputs that correspond to at least some of the inputs and outputs of the design model. Exemplary tests include test models, test harnesses, test programs or scripts, data driven tests, etc., and may be open loop or closed loop tests. A test model may specify data for its outputs, which may be used to drive the inputs of the design model, thereby testing the design model. A test model may also specify data logging or test criteria, such as pass/fail criteria, for its inputs, which are driven by the outputs of the design model. A test model or other test also may include one or more initialization and parameter setting objects for specifying values for the design model's initialization settings and parameters during test runs of the design model. During testing, the design model may be referred to as a device under test (DUT) or as a unit under test (UUT).

A broker may be configured to construct the interface specification. The interface specification may identify external inputs, external outputs, initialization settings, and parameters of the design model. It may also specify outputs, inputs, initialization setting objects, and parameter setting objects of the tests. Proposed changes to the design model's interface, for example through user-initiated edits, are captured by the broker. The broker may determine one or more corresponding changes to the tests and to the interface specification that need to be made in order to maintain consistency among the design model, the interface specification and the tests. The proposed change to the design model's interface is carried out, and the determined changes to the interface specification and to the tests are automatically applied so that the interface specification and the tests remain consistent with the changed design model. Changes to the design model that do not alter its interface may be ignored by the broker, and may not result in any corresponding changes to the interface specification or the tests.

The broker may also capture proposed changes to the interface specification. That is, the interface specification may be presented in a user-editable form. The broker examines the proposed changes to the interface specification, determines corresponding changes to the interface of the design model and to the other tests. The proposed change to the interface specification may be carried out, and the broker may automatically apply the determined changes to the design model and to the tests to maintain consistency among the interface specification, the tests and the design model. The broker may similarly capture proposed changes to the interfaces of the tests, and apply those changes to the interface specification and to the design model.

In an embodiment, changes to the design model, the interface specification and the tests may be performed as part of a single transaction, such as an atomic transaction. Accordingly, the changes to the design model, the interface specification and the tests may be guaranteed to complete.

In an embodiment, the design model and the tests may be configured to point to the interface specification, which may be referred to as a mirror diagram. That is, the design model and the tests may point to the same interface specification, e.g., the one mirror diagram. Changes, such as user edits, made to the interface of the design model or to the interface of the tests are applied to the single interface specification. Similarly, changes to the interface specification are applied to the design model and to the tests. Thus, rather than the design model and the tests having their own separate interfaces, a single interface specification is created for both the design model and the tests. In this embodiment, the atomic and/or automatic modifying of both the design model and the tests may be avoided.

Data Processing System

FIG. 1 is a schematic illustration of a computer or data processing system 100 for implementing and utilizing an embodiment of the invention. The computer system 100 includes one or more processing elements, such as a processing element 102, a main memory 104, user input/output (I/O) 106, a data storage unit, such as a disk drive 108, and a removable medium drive 110 that are interconnected by a system bus 112. The computer system 100 may also include a communication unit, such as a network interface card (NIC) 114. The user I/O 106 may include a keyboard 116, a pointing device, such as a mouse 118, and a display 120. Other user I/O 106 components include voice or speech command systems. Other pointing devices include touchpads and touchscreens, and other output devices include printers, projectors, etc. Exemplary processing elements include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 104 may store a plurality of program libraries or modules, such as an operating system 122, and one or more application programs that interface to the operating system 122, including a modeling environment application 200.

The removable medium drive 110 may accept and read a computer readable medium 126, such as a CD, DVD, floppy disk, solid state drive, tape, flash memory or other medium. The removable medium drive 110 may also write to the computer readable medium 126.

Suitable computer systems include personal computers (PCs), workstations, laptops, tablets, palm computers, smart phones, electronic readers, and other portable computing devices, etc. Nonetheless, the computer system 100 of FIG. 1 is intended for illustrative purposes only, and the present invention may be used with other computer systems, data processing systems, or computational devices. The present invention may also be used in a networked, e.g., client-server, computer architecture, or a public and/or private cloud computing arrangement. For example, the modeling environment application 200 may be hosted on a server, and accessed by a remote client through an application hosting system, such as the Remote Desktop Connection tool from Microsoft Corp of Redmond, Wash.

Suitable operating systems 122 include the Windows series of operating systems from Microsoft Corp., the Linux operating system, the MAC OS® series of operating systems from Apple Inc. of Cupertino, Calif., and the UNIX® series of operating systems, among others.

As indicated above, a user or developer, such as an engineer, scientist, programmer, test engineer, etc., may utilize one or more input devices, such as the keyboard 116, the mouse 118, and the display 120 to operate the modeling environment 200, and construct one or more design models of a system that is being designed or evaluated, and one or more test models for testing the design models. The design models and the test models may be computational and may have executable semantics. In particular, they may be executable. The design models may provide one or more of time-based, event-based, state-based, frequency-based, control-flow based, and dataflow-based execution semantics. A design model may be executed to simulate operation of the system that is being modeled, e.g., a physical system. The execution of a design model may be referred to as simulating the model.

In an embodiment, the modeling environment 200 is a high-level modeling environment. Suitable high-level modeling environments include the MATLAB® and Simulink® technical computing environments from The MathWorks, Inc. of Natick, Mass., as well as the Simscape physical modeling system and the Stateflow charting tool also from The MathWorks, Inc., the MapleSim physical modeling and simulation tool from Waterloo Maple Inc. of Waterloo, Ontario, Canada, the LabVIEW programming system and the NI MatrixX model-based design product both from National Instruments Corp. of Austin, Tex., the Visual Engineering Environment (VEE) from Agilent Technologies, Inc. of Santa Clara, Calif., the System Studio model-based signal processing algorithm design and analysis tool from Synopsys, Inc. of Mountain View, Calif., the SPW signal processing algorithm tool from Synopsis, a Unified Modeling Language (UML) system, a Systems Modeling Language (SysML) system, the System Generator system from Xilinx, Inc. of San Jose, Calif., and the graphical modeling systems described in U.S. Pat. No. 7,324,931 for Conversion of Model Components Into References and U.S. Pat. No. 7,991,598 for Method and System for Modeling a Mechanical System, which are hereby incorporated by reference in their entireties, among others. Models created in the high-level modeling environment may contain less implementation detail, and thus operate at a higher level than certain programming languages, such as the C, C++, C#, and SystemC programming languages.

Those skilled in the art will understand that the MATLAB® technical computing environment is a math-oriented, textual programming environment for digital signal processing (DSP) design, among other uses. The Simulink® technical computing environment is a model-based design environment for modeling and simulating dynamic systems, among other uses. The MATLAB® and Simulink® tools provide a number of high-level features that facilitate algorithm development and exploration, and support model-based design. Exemplary high-level features include dynamic typing, array-based operations, data type inferencing, sample time inferencing, and execution order inferencing, among others.

In another embodiment, a lower level programming language, such as the C, C++, and C# programming languages, among others, may be used to create the design model and the test models instead of a high-level modeling environment.

Modeling Environment

Figure 2:
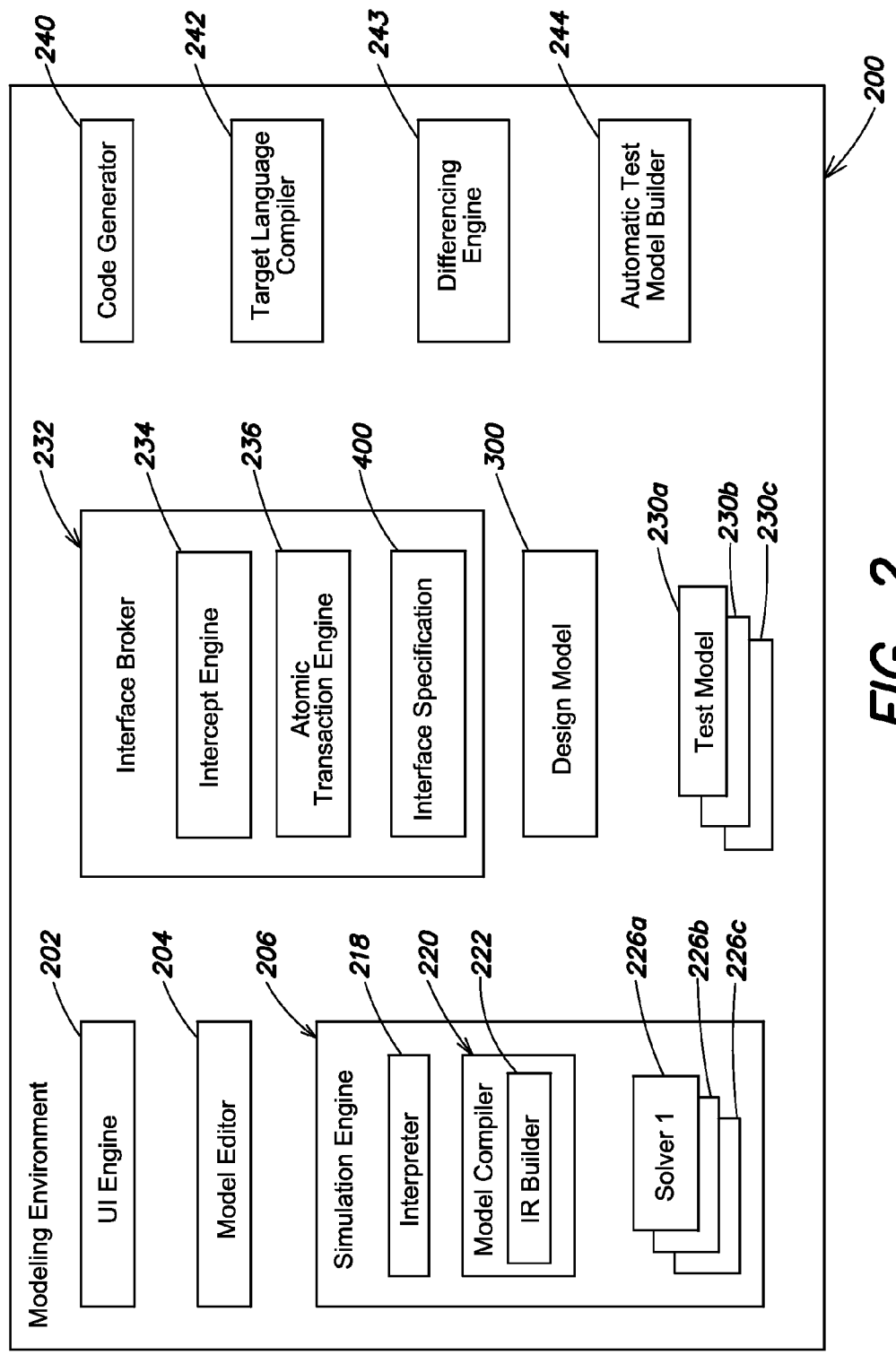
FIG. 2 is a partial functional diagram of a modeling environment in accordance with an embodiment of the present invention.

FIG. 2 is partial block diagram of an embodiment of the modeling environment 200. The environment 200 may include a user interface (UI) engine 202, a model editor 204, and a simulation engine 206. The simulation engine 206 may include an interpreter 218, a model compiler 220 that, in turn, may include one or more Intermediate Representation (IR) builders, such as IR builder 222, and one or more, and preferably a plurality, of solvers, such as solvers 226a-c. Exemplary solvers include one or more fixed-step continuous solvers, which may utilize integration techniques based on Euler's Method or Huen's Method, and one or more variable-step solvers, which may be based on the Runge-Kutta and Dormand-Prince pair. A non-exhaustive description of suitable solvers may be found in the *Simulink 7 User's Guide* from The MathWorks, Inc. (September 2011 ed.), which is hereby incorporated by reference in its entirety.

The model editor 204 may be used to construct one or more design models, such as design model 300. The model editor 204 also may be used to construct one or more test models 230a-c for testing the design model 300.

In an embodiment, an interface broker 232 may be integrated in the modeling environment 200. The interface broker 232, which also may be referred to as a broker 232, may include an intercept engine 234, and an atomic transaction engine 236. The broker 232 may further include or have access to one or more interface specifications, such as interface specifications 400. In an embodiment, the broker 232 may construct and maintain at least one interface specification 400 for each design model, such as design model 300.

The modeling environment 200 may include other components, such as a code generator 240, a target language compiler 242, a differencing engine 243, and an automatic test model builder 244. The code generator 240 may be configured to generate computer programming code, such as source and/or object code, from a model. The target language compiler 242 may be configured to compile source code, such as source code generated by the code generator 240, for execution by a target platform or target hardware. The differencing engine 243 may be configured to analyze two models, and generate a report that describes the differences between the two models. The automatic test model builder 244 may be configured to construct a test model for a design model automatically. Suitable code generators for use with the present invention include, but are not limited to, the Simulink Coder, the Embedded Coder, and the Simulink HDL Coder products from The MathWorks, Inc., and the TargetLink product from dSpace GmbH of Paderborn Germany. However, other code generation systems may be used.

The broker 232 and the automatic test model builder 244 as well as other components of the modeling environment 200 may each comprise registers and combinational logic configured and arranged to produce sequential logic circuits. In an embodiment, the broker 232 and the automatic test model builder 244 may be implemented through one or more software modules or libraries containing program instructions pertaining to the methods described herein. The software modules may be stored on main memory 104 and/or computer readable media, such as computer readable medium 126, and executable by one or more processing elements, such as processing element 102. Other computer readable media may also be used to store and execute these program instructions. In alternative embodiments, various combinations of software and hardware, including firmware, may be utilized to implement the present invention.

The interface specification 400, the design model 300, and the test models 230 may be implemented through files, tables, trees, or other data structures or objects. They may be stored on main memory 104, persistent memory 108, and/or medium 126.

Figure 3:
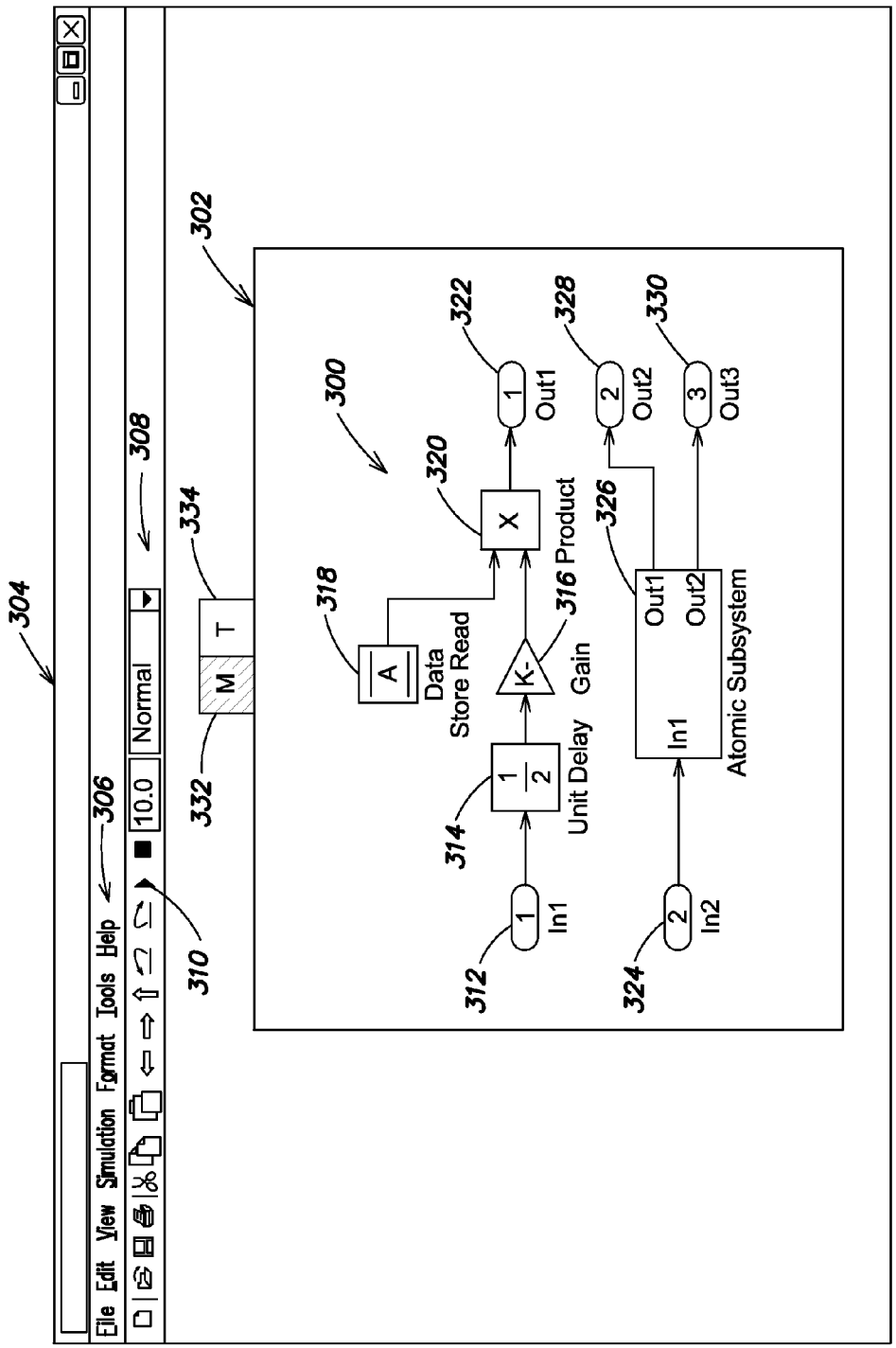
FIG. 3 is an illustration of a graphical design model having executable semantics in accordance with an embodiment of the present invention.

FIG. 3 is a schematic illustration of the design model 300, which may be a computer-generated graphical design model having executable semantics. The design model 300 may be opened or constructed on a model canvas 302 of a model editor 304. For example, a user may select a plurality of graphical objects, such as icons or blocks, from one or more libraries of pre-defined objects, and place the selected objects onto a model canvas that may be managed by the model editor 204. The user also may establish relationships, such as connections, among the blocks, which may or may not be visually represented on the model canvas. The graphical objects of the design model may represent dynamic systems, computations, functions, operations, events, or states, and the connections, which may appear as wires or arrows among the objects, may represent data, control, signals, events, mathematical relationships, physical connections, etc. In an embodiment, a set of interconnected blocks may be organized into a subsystem, and a set of states may be organized into a subchart.

In particular, the UI engine 202 and model editor 204 may provide or support a graphical user interface (GUI) that includes the model canvas for displaying a graphical design model. The graphical model may be a Simulink model, a Stateflow chart, a LabVIEW block diagram, a VEE diagram, a MATLAB file, a MatrixX model, etc. The design model may represent a real world, dynamic system, such as an aircraft flight controller, an engine control unit (ECU), a power window controller, an electronic circuit, a financial system or instrument, a natural phenomenon, such as a weather patterns, etc.

In addition to the model canvas 302, the model editor 304 may include a menu bar 306, and a toolbar 308, among other graphical elements. The toolbar 308 may include a Run button 310, among other command buttons. In response to a user selecting the Run button 310, for example with the mouse 118, the simulation engine 206 may execute the design model 300. Execution of the design model 300 may also be referred to as simulation of the design model 300.

The design model 300 includes a first Inport block (In1) 312 connected to a Unit Delay block 314, which is connected to a Gain block 316. The Gain block 316 and a Data Store Memory Read block 318 are connected to a Product block 320. The Product block 320 is connected to a first Outport block (Out1) 322. In addition, a second Inport block (In2) is connected to an atomic subsystem block 326, which is connected to second and third Outport blocks (Out2 and Out3) 328, 330. The atomic subsystem block 326 may itself represent, in a hierarchical manner, a plurality of interconnected graphical objects, such as blocks.

A design model may be specified graphically, textually or a combination of graphically and textually.

The design model may and typically does have an interface, which may be referred to as an external interface. The external interface of a design model may include the external inputs to the design model, the external outputs from the design model, the one or more initialization states, and the one or more parameters whose values may be defined for the design model. In an embodiment, values for the external inputs and outputs of the model may change over time. For example, one or more of the inputs and outputs may be time-varying signals, where the values of the one or more initialization states and parameters may not change with time. Instead, values for the one or more initialization states and the parameters may be set once for each execution, e.g., simulation, of the design model. To the extent the design model is a graphical model, such as a block diagram model, the external inputs and outputs may be defined graphically.

The external interface of a design model may also include one or more control signals that may be used in the design model to control the execution of one or more portions of the model, such as one or more conditional subsystems of the design model. Exemplary control signals for conditional subsystems include: an enable control signal, which may cause a respective subsystem to execute when the enable control signal is positive; a triggered control signal which may cause a respective subsystem to execute when a trigger event occurs; and a control flow signal that may cause a respective subsystem to execute under the control of another object of the design model, such as a control block.

The input to the subsystem block 326 is an internal input of the design model 300, and thus not part of the model's external interface. Similarly, the outputs of the subsystem block 326 are internal outputs, and thus not part of the model's external interface. Note, however, that the outputs of the subsystem block 326 drive the second and third Outport blocks 328, 330, which are external outputs, and thus part of the model's external interface.

In addition to the design model canvas 302, the model editor 304 may provide one or more test model canvases. In an embodiment, the model editor 304 may provide a design model tab (M) 332, and a test model tab (T) 334. A user may switch between the design model canvas 302 and a test model canvas by selecting, e.g., with the mouse 118, the respective tab 332, 334. Furthermore, the model editor 204 may assign test models opened or created in the test model canvas to the design model opened in the design model canvas 302. For example, the design model 300 and the test models opened or created in the test model canvas may be saved to a model workspace whose scope is set to the design model 300.

Interface Specification

FIGS. 4A and B are a schematic illustration of an interface specification 400 for a design model. The interface specification 400 may be organized as a table having a plurality of columns and rows that define cells or records for storing information. The interface specification 400 may have a first section 402 for storing information concerning external inputs, a second section 404 for storing information concerning external outputs, a third section 406 for storing information concerning initialization states, a fourth section 408 for storing information concerning parameters, and a fifth section 410 for storing information concerning control signals.

Each section 402, 404, 406, 408, and 410 may include one or more rows for storing information concerning particular inputs, outputs, initialization states, parameters, and control signals. More specifically, the external inputs section 402 may include an external input name column 412, an external input data type column 414, an external input numeric type column 416, an external input data dimension column 418, and an external input sampling mode column 420. Examples of data types include unsigned 8-bit integer, double-precision floating point, single-precision floating point, and fixed point. Examples of numeric type include real or complex. Examples of dimensionality include one-dimensional, e.g., scalars and vectors, two-dimensional, e.g., arrays, or multi-dimensional, e.g., multi-dimensioned matrices. Examples of sampling modes include sample-based, in which a signal has one data sample, and frame-based, in which a signal includes a collection of sequential samples, e.g., from a single channel or multiple channels Like the external inputs section 402, the external outputs section 404 may also include an external output name column 422, an external output data type column 424, an external output numeric type column 426, an external output data dimension column 428, and an external output sampling mode column 430. The initialization states section 406 may include an initialization state name column 432, an initialization state data type column 434, an initialization state numeric type column 436, and an initialization state data dimension column 438. The parameters section 408 may include a parameter name column 440, a parameter data type column 444, and a parameter data dimension column 446. The control signals section 410 may include a control signal name column 448, a control signal data type column 450, a control signal numeric type column 452, and a control signal data dimension column 454.

The interface specification 400 also may include information about the mapping between one or more associated test models and the external interface of the design model. In particular, the interface specification 400 may include a first region 456 for a first associated test model, a second region 458 for a second associated test model, and so on. One or more of the external inputs of the design model, as listed in the external inputs section 402, may map to external outputs of the test models, which may be listed in a name column 460 of the first region 456, and a name column 470 of the second region. The external outputs of the design model, as listed in section 404, may map to external inputs of the test models, which may be listed in name columns 462, 472 of the first and second regions 456, 458. The initialization states of the design model, as listed in section 406, may map to objects of the test models that set values to those initialization states, and the objects may be listed in name columns 464, 474 of the first and second regions 456, 458. The parameters of the design model, as listed section 408, may map to objects of the test models that set values to those parameters, and the objects may be listed in name columns 466, 476 (FIG. 4B) of the first and second regions 456, 458. The control signals of the design model, as listed in section 410, may map to objects of the test models that set values to those control signals, and the objects may be listed in name columns 468, 478 of the first and second regions 456, 458.

Depending on the particular design model, at least some of the sections may be empty, e.g., have no rows.

FIGS. 5A-E illustrate a flow diagram of a method in accordance with an embodiment of the invention. The modeling environment 200 may receive inputs, e.g., from a user, opening, constructing, editing, or analyzing one or more design models, which may be stored in main memory 104 or persistent memory 108, as indicated at block 502. The modeling environment 200 also may receive inputs, e.g., from a user, creating one or more test models for a given design model, or assigning one or more test models to the given design model, as indicated at block 504. The one or more test models also may be stored in main memory 104 or persistent memory 108. Like the design model, a test model also may be specified graphically, textually or a combination of graphically and textually. For example, a test model may be specified graphically as a test model. A test model may be created manually, e.g., by a user, or automatically, for example, by the automatic test model builder 244.

The broker 232 may analyze the design model 300 to identify the model's external interface, as indicated at block 506. For example, the broker 232 may evaluate an in-memory representation of the design model 300, such as representation constructed by the IR builder 222, and identify the design model's external inputs, outputs, initialization states, parameters, and control signals. Utilizing this information, the broker 232 may construct the interface specification 400, which may also be referred to as an interface definition, for the design model, as indicated at block 508.

The design model 300 includes two external inputs, i.e., the two Inport blocks (In1 and In2) 312, 324, and three external outputs, i.e., the three Outport blocks (Out1, Out2, and Out3) 322, 328, 330. The design model's interface also includes a plurality of parameters. Specifically, the data store memory read block 318, whose value may be set at the start of a simulation of the design model 300, represents a first parameter of the design model 300. In addition, instead of specifying a numeric value, such as '5', the Gain block 316 specifies its gain value as a variable, i.e., 'K'. The variable 'K', which also may be referred to as a parameter of the Gain block 316, is a second parameter of the design model 300. In particular, the value of K may be set at the start of a simulation of the design model 300.

The input to the subsystem block 326 is an internal input of the design model 300, and thus not part of the model's external interface. Similarly, the outputs of the subsystem block 326 are internal outputs, and thus not part of the model's external interface. Note, however, that the outputs of the subsystem block 326 drive the second and third Outport blocks 328, 330, which are external outputs, and thus part of the model's external interface.

The broker 232 also may identify one or more test models 230 that are associated with the design model 300, as indicated at block 510. In addition, the broker 232 may analyze each of the one or more associated test models, determine a mapping between the test models and the design model, and include this mapping information in the interface specification 400, as indicated at block 512.

In an embodiment, the design model 300 and one or more test models may register with the broker 232 in order to receive notifications of proposed changes to the interface specification 400. In another embodiment, each test model may register with the broker 232 to receive notifications of proposed interface specification changes. As part of the registration process, the design model 300 may specify one or more functions to be called in response to particular changes being made to the interface specification 400. For example, the design model 300 may specify a first function that causes a particular type of external input to be added to the design model 300, when the change to the interface specification is the addition of a new input. Similarly, each test model, e.g., as part of the registration process, may specify one or more functions to be called in response to particular changes to the interface specification 400.

Figure 5A:
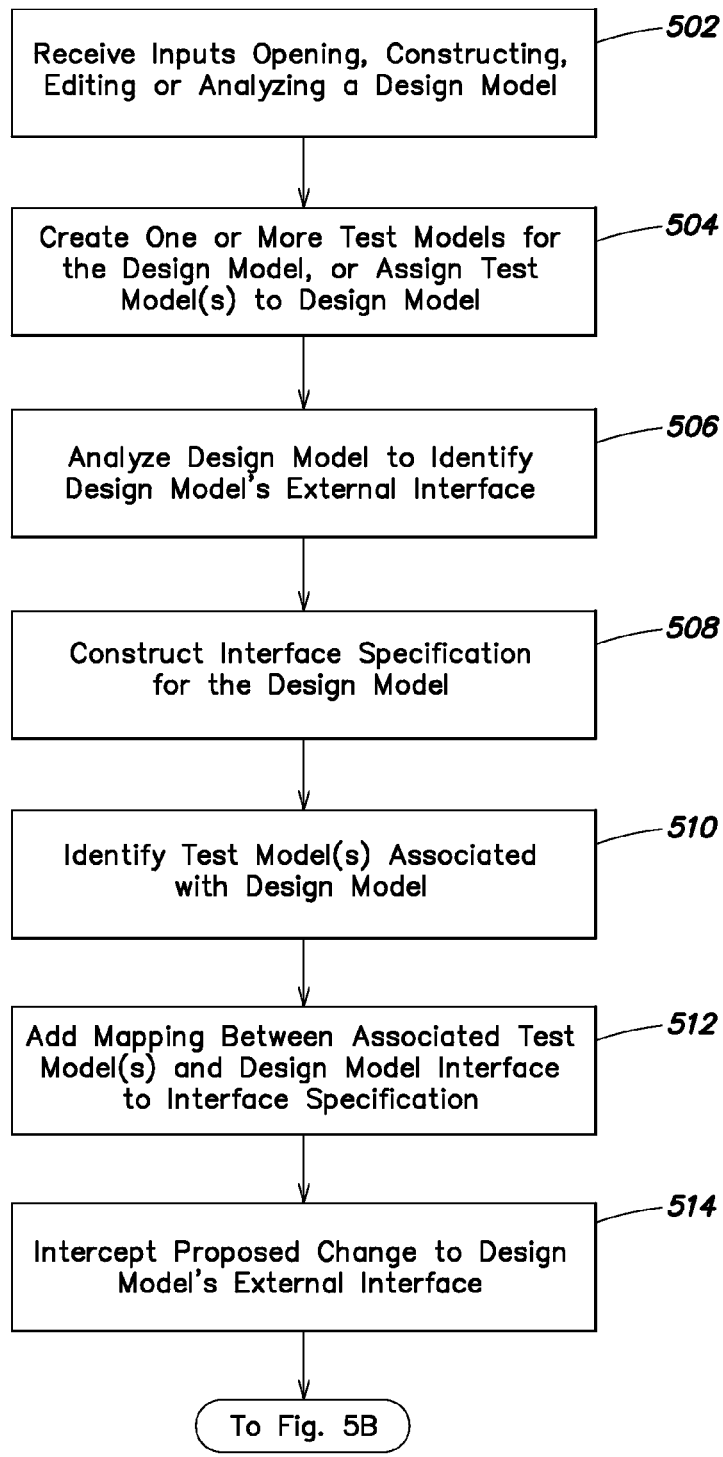
FIGS. 5A-E is a flow diagram of a method in accordance with an embodiment of the present invention.
Figure 5B:
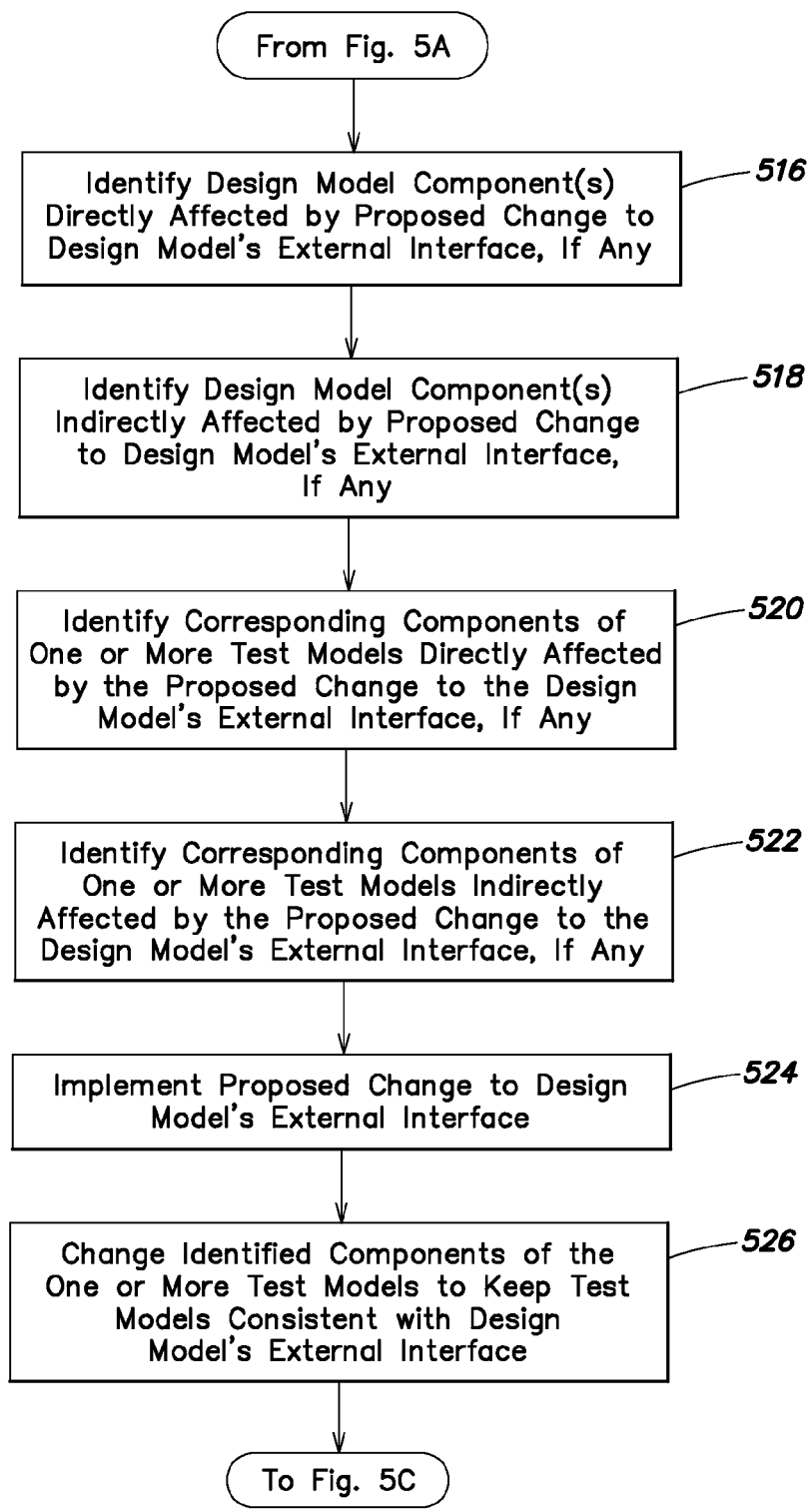

The broker 232 intercepts requested or proposed changes to the design model's external interface, as indicated at block 514. Exemplary changes, which may be user-initiated, e.g., through the model editor 204, include adding or removing an external input or an external output of the design model, and modifying the data type of an existing external input. The broker 232 may intercept the requested change before it is carried out, e.g., by the model editor 204. In an embodiment, the broker 232 may operate with the differencing engine 243 to identify proposed changes to the design model's external interface. For example, the differencing engine 243 may be adapted to detect proposed changes that affect the external interface of the design model 300, and to notify the broker 232 of such proposed changes. The broker 232 may examine the proposed change and, to the extent it represents a direct change to one or more components of the design model 300, the broker 232 may identify such components, as indicated at block 516 (FIG. 5B). To the extent the proposed change, if carried out, indirectly affects one or more components of the design model 300, the broker 232 may also identify such components, as indicated at block 518.

A proposed change may affect one or more components, without directly changing those components. For example, suppose the design model includes a plurality of external inputs that are numbered sequentially from 0-12. Suppose further that the proposed change is the deletion of external input 9. In this case, the proposed change directly affects external input 9, which is being deleted. The proposed change also indirectly affects external inputs 0-12, because the modeling environment 200 may be configured to renumber them as external inputs 9-11 following the deletion of original external input 9.

In an embodiment, the broker 232 may only intercept proposed changes to the design model's external interface. Other changes, for example, to internal interfaces of the design model, to internal graphical objects or subsystems, to model-level attributes, such as the solver to be used during model execution, etc., may not be intercepted by the broker 232. Instead, these changes may be implemented, e.g., by the model editor 204, as requested.

In addition to identifying the components directly and indirectly affected by the proposed change, the broker 232 may identify one or more components of the associated test models that are directly affected by the proposed change to the design model's external interface, as indicated at block 520. The broker 232 also may identify one or more components of the test models indirectly affected by the proposed change, as indicated at block 522. The broker 232 may utilize the mapping information from the interface specification 400 to identify the components of the one or more test models that correspond to the directly and indirectly affected components of the design model. For example, the broker 232 may identify the rows corresponding to the affected design model components, which may also identify corresponding components of the test models.

Suppose the proposed change is to delete the external output 'Out2' 328. The broker 232 may find the entry of the interface specification 400 that corresponds to the external output 'Out2' 328, and follow that entry to identify the components of the test models that correspond to the external output 'Out2' 328. In this case, the 'In2' component of the first test model, and the 'In2' component of the second test model correspond to the external output 'Out2' of the design model 300. The deletion of external output 'Out2' 328 may also result in external output 'Out3' 330 having to be renumbered to 'Out2,' to avoid any gaps in the sequence of outport numbers. Accordingly, the broker 232 may determine that deleting external output 'Out2' 328 also indirectly affects external output 'Out3' 330. Similarly, the broker 232 may determine that component 'In3' of test model 1, and component 'In3' of test model 2 will need to be renumbered as component 'In2' in response to deleting the existing component 'In2.' Accordingly, the broker 232 may determine that these two 'In3' components are indirectly affected by deleting external output 'Out2' 328, which results in the deletion of components 'In2' of the two test models.

Figure 5C:
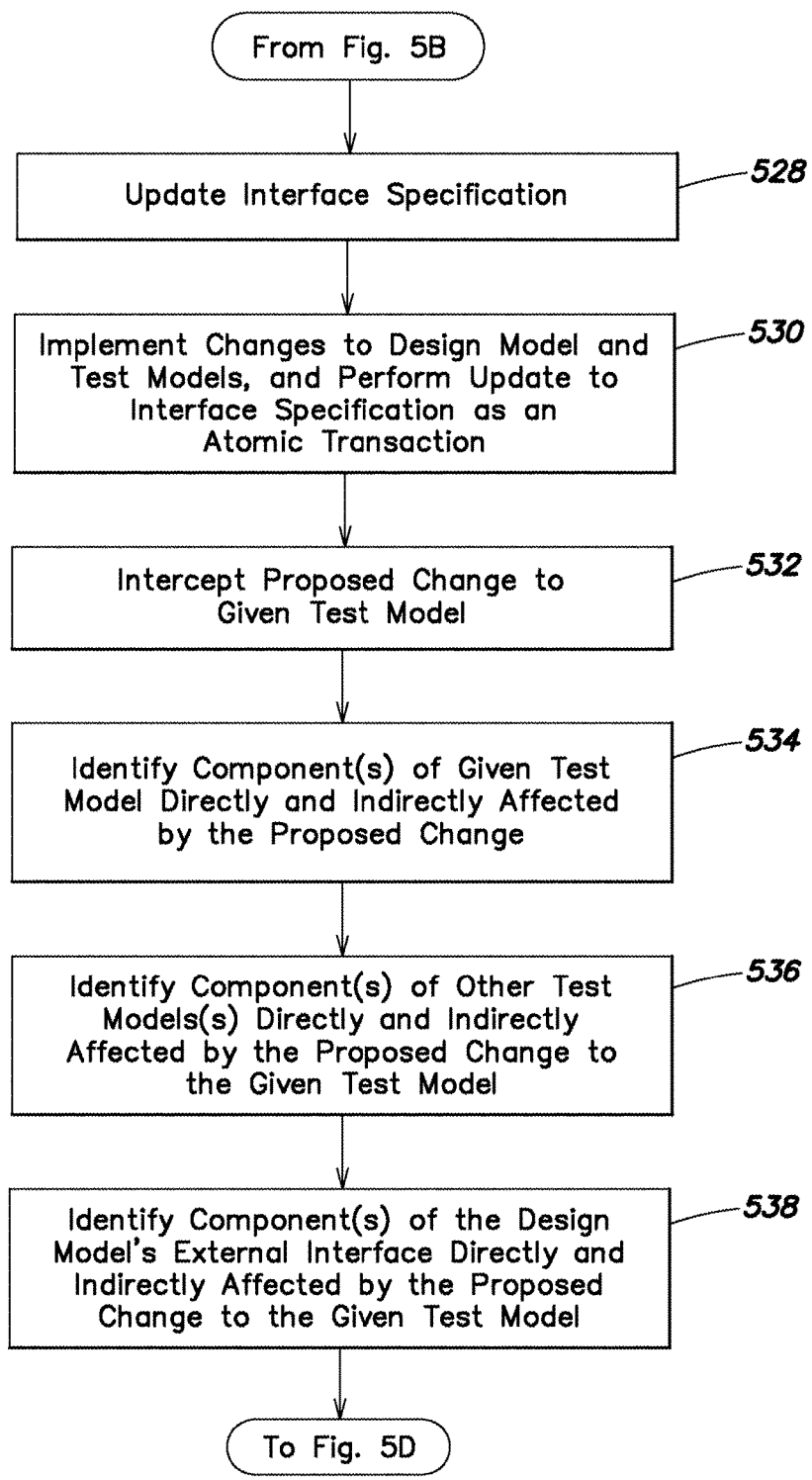

The broker 232 may then implement the proposed change to the design model's external interface, as indicated at block 524. In addition, the broker 232 may change the identified components of the one or more test models to keep the one or more test models consistent with the design model 300, as indicated at block 526. The broker 232 also may update the interface specification 400 to reflect the changes made to the design model 300 and to the one or more test models 230, as indicated at block 528 (FIG. 5C).

In an embodiment, the atomic transaction engine 236 executes the changes to the design model 300 and to the one or more test models 230, and also updates the interface specification 400 as an atomic transaction, as indicated at block 530. By changing the design model interface 400 and the one or more test models as an atomic transaction the broker 232 prevents the test models from becoming inconsistent with the external interface of the design model 300.

The broker 232 also may intercept changes directed to a given one of the test models 230 associated with a design model 300, as indicated at block 532. The broker 232 may examine the proposed change and determine the components of the given test model that are directly and indirectly affected by the proposed change, as indicated at block 534. The broker 232 also may identify the corresponding components of the other test models directly and indirectly affected by the proposed change to the given test model, as indicated at block 536. In addition, the broker 232 may identify the corresponding components of the design model's external interface that are directly and indirectly affected by the proposed change to the given test model, as indicated at block 538. The broker 232 may utilize the mapping information in the interface specification 400 to identify the corresponding components of the design model 300 and the other test models.

Figure 5D:
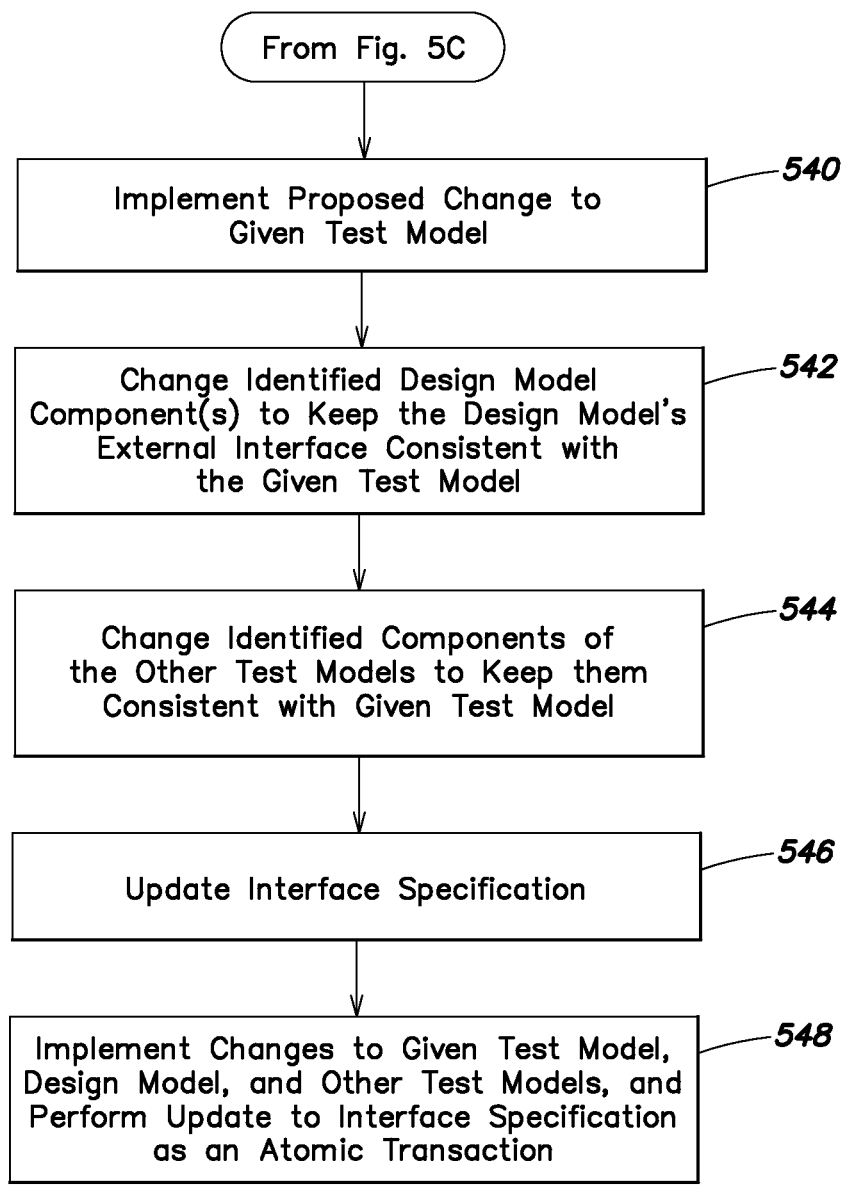

The broker 232 may implement the proposed change to the given test model, as indicated at block 540 (FIG. 5D). The broker 232 also may change the identified components of the design model to keep the design model interface consistent with the given test model, as indicated at block 542. In addition, the broker 232 may change the identified components of the other test models to keep them consistent with the given test model, as indicated at block 544. Furthermore, the broker 232 may update the interface specification 400 to reflect the changes to the given test model, the design model, and the other test models, as indicated at block 546. The changes to the given test model, the design model 300, and the other test models, and the updating of the interface specification 400 may all be performed as an atomic transaction, as indicated at block 548.

Figure 5E:
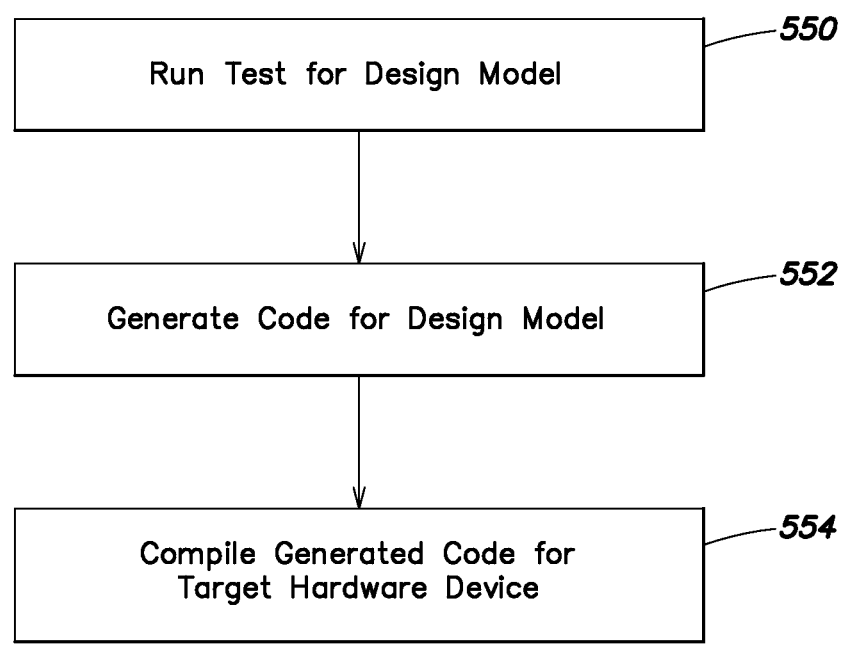

The design model 300 may be tested using one or more of the test models, as indicated at block 550 (FIG. 5E). For example, the design model 300 may be executed, e.g., simulated, using one of the test models, which may define values for model's external inputs, initialization states, parameters, and control signals, and may log or verify the model's external outputs.

In an embodiment, design model execution may be carried out over a time span, e.g., a simulation time, which may be user specified or machine specified. A compile stage may mark the start of execution of the design model, and may involve preparing data structures and evaluating parameters, configuring and propagating block characteristics, determining block connectivity, and performing block reduction and block insertion. The preparation of data structures and the evaluation of parameters may create and initialize one or more data structures used in the compile stage. For each of the blocks, a method may force the block to evaluate all of its parameters. This method may be called for all blocks in the design model. If there are any unresolved parameters, execution errors may be thrown. During the configuration and propagation of block and port/signal characteristics, the compiled attributes (such as data dimensions, data types, complexity, sample modes, and sample time) of each block (and/or ports) may be setup on the basis of the corresponding behaviors and the attributes of blocks (and/or ports) that are connected to the given block through lines, e.g., arrows. The attribute setup may be performed through a process during which block behaviors "ripple through" the design model from one block to the next following signal or other connectivity.

This process is referred to as "propagation." In the case of a block that has explicitly specified its block (or its ports') behaviors, propagation helps ensure that the attributes of the block are compatible with the attributes of the blocks connected to it. If not, an error may be issued. Secondly, in many cases, blocks are implemented to be compatible with a wide range of attributes. Such blocks may adapt their behavior in accordance with the attributes of the blocks connected to them. This is similar to the concept of polymorphism in object-oriented programming languages. The exact implementation of the block may be chosen on the basis of the design model in which the block finds itself. Included within this step are other aspects such as validating that all rate-transitions yield deterministic results, and that the appropriate rate transition blocks are being used. The compilation step also may determine actual block connectivity. For example, virtual blocks may play no semantic role in the execution of a design model. In this step, the virtual blocks may be optimized away, e.g., removed, and the remaining non-virtual blocks may be reconnected to each other appropriately. This compiled version of the design model with actual block connections may be used from this point forward in the execution process. The way in which blocks are interconnected in the design model does not necessarily define the order in which the equations (methods) corresponding to the individual blocks will be solved (executed). The actual order may be determined during the sorting step in compilation. In an embodiment, once the compilation step has completed, the sorted order may not be changed for the entire duration of the design model's execution.

This same compilation stage may also be performed for one or more of the test models.

Following the compilation stage, code may or may not be generated for the design model 300, as indicated at block 552. If code is generated, the design model 300 may be executed through an accelerated execution mode in which the design model 300, or portions of it, is translated into either software modules or hardware descriptions, which broadly referred to herein as code. If this stage is performed, then the stages that follow use the generated code during the execution of the design model. If code is not generated, the design model may execute in an interpretive mode in which the compiled and linked version of the design model may be directly utilized to execute the design model over the desired time-span. When users generate code for a design model, they may choose to not proceed further with the model's execution. Instead, they may choose to take the code and deploy it outside of the confines of the modeling environment 200.

In addition, the code generator 240 may generate code for the design model, as previously indicated at block 552, and may store the generated code for the design model in memory, e.g., persistent memory, such as the hard drive 108. The UI engine 202 may provide or support a Code Generation button in the GUI that may be selected by the user, or the UI engine 202 may receive a code generation command entered by the user, e.g., in the GUI or the CLI. The code generation command also may be invoked programmatically, for example, when a particular event occurs. In response to the code generation command being activated, the code generator 240 may generate code for the design model.

In an embodiment, the generated code may be textual code, such as textual source code, that may be compiled and executed on a target machine or device. The generated code may conform to one or more programming languages, such as Ada, Basic, C, C++, C#, SystemC, FORTRAN, VHDL, Verilog, embedded MATLAB, a vendor or target specific HDL code, such as Xilinx FPGA libraries, assembly code, etc. For example, one or more code generation files, such as header, main, make, and other source files may be generated for the design model. The target language compiler 242 may compile the generated code for execution by target hardware, such as a microprocessor, a Digital Signal Processor (DSP), a Field Programmable Gate Array (FPGA), etc., as indicated at block 554. In an embodiment, the code generator 240 also may generate code for some or all of the test model(s), and this generated code also may be compiled by the target language compiler 242.

In an embodiment, the broker 232 may be implemented through the well-known model-view-controller paradigm. Here, the interface specification 400 may be equated with the 'model', the design model 300 and the test models 230 may be equated with the 'views', and the broker 232 may be equated with the 'controller'. The model-view-controller paradigm is described in S. Burbeck, *Application Programming in Smalltalk-80: How to use Model-View-Controller (MVC)*, University of Illinois in Urbana-Champaign (UIUC) Smalltalk Archive, and in S. Morse et al., *Introducing Application Design and Software Engineering Principles in Introductory CS Courses: Model-View-Controller Java Application Framework*, Journal of Computing Sciences in Colleges, Vol. 20, Issue 2 (December 2004), which are hereby incorporated by reference in their entireties.

The broker 232 may be implemented using other software paradigms, such as semaphore technology, etc.

In an embodiment, the design model 300 and each test model 230 are separate, stand-alone objects that are distinct from each other, although they form a group or entity for purposes of changes to the interface specification 400. The design model 300 and the test models 230 may be separate partitions within a single container. For example, the design model 300 may be a design model type file, such as a .mdl file, and the test models 230 may be test model type models stored within a container, such as a single zip or tar file, a single folder, a single directory, or a single project. The container, such as the zip or tarr file or the folder, directory or project, may also include the interface specification 400.

By maintaining the design model 300 and the test models 230 as separate and distinct files, objects or other entities, changes (other than changes to the interface specification) may be made to one without causing changes in the other. For example, because they are created and maintained as separate entities, such as separate objects or files, the propagation of block or signal attributes cannot occur between a test model 230 and the design model 300, or between the design model 300 and a test model 230. Accordingly, changes (other than to the interface specification 400) may be made to the design model 300 or to a test model 230 without affecting the other. For example, changes to the internal input/output of the design model 300, to the algorithm represented by the design model 300, etc., do not alter or influence the execution behavior of the test models 230. Similarly, changes to a test model, other than to the interface specification 400, do not alter or influence the execution behavior of the design model 300 or the other test models.

Furthermore, if the only change to a test model is the addition of a new test sequence or a new test vector, then a test engineer may run just the new test sequence or test vector, rather than re-running all of the tests associated with the design model 300.

In another embodiment, the broker 232 may be configured to synchronize changes to the design model's external interface with changes to the test models associated with the design model 300. For example, instead of intercepting proposed change requests, the broker 232 may log changes to the external interface whether those changes are initiated from the design model 300 or one of the test models 230. Specifically, the broker 232 may log the entity making the change, and the particular change being made. At a predetermined point, the broker 232 may examine the log, and apply the logged changes to the design model 300 and/or one or more test models 230 associated with the design model 300, thereby synchronizing the test models 230 and the design model 300. The predetermined point may be set to a particular number of pending changes in the log, to a particular time interval between updates, or other criteria.

Figure 6:
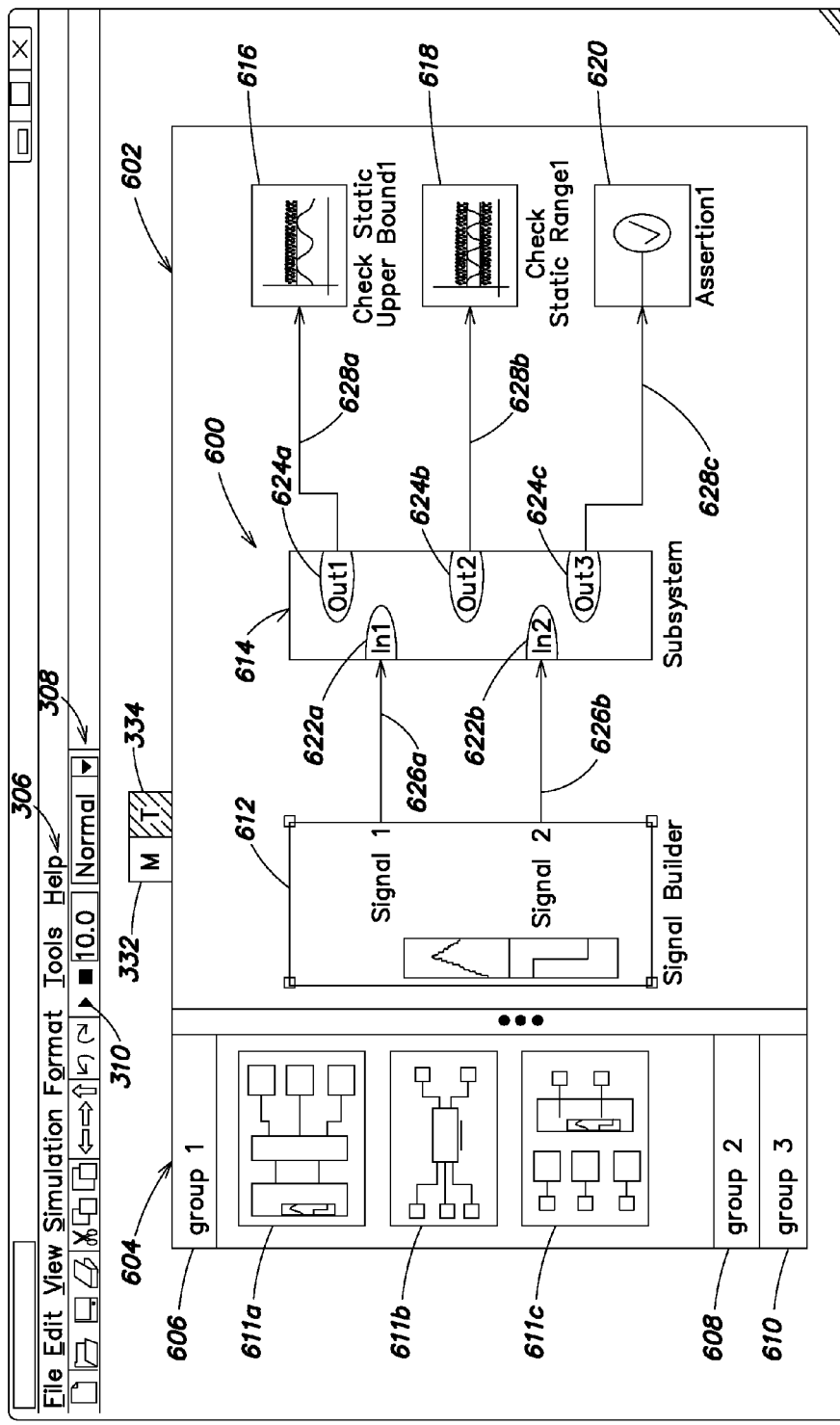
FIG. 6 is an illustration of a test model having executable semantics in accordance with an embodiment of the present invention.

FIG. 6 is a schematic illustration of a test model 600 opened or constructed on a test model canvas 602, which may be accessed by selecting the test model tab (T) 334. In addition to the test model canvas 602, a test model project pane 604 may be provided. The test model project pane 604 may contain at least some of the test models assigned to or associated with the design model 300 (FIG. 3). In an embodiment, pane 604 includes all of the test models. The plurality of test models may be organized into groups or folders within the project pane 604, such as 'Group 1' 606, 'Group 2' 608, and 'Group 3' 610. A given group or folder, such as 'Group 1' 606, may be opened, for example through user selection with the mouse 118, and the test models contained in that group or folder may be represented by thumbnail images, such as thumbnails 611*a-c*, within the project pane 604. By selecting the thumbnail image, such as thumbnail 611*a*, for a particular test model from the project pane 604, the respective test model, such as the test model 600, may be opened and presented in the test model canvas 602. Other objects instead of thumbnails may be used in the project pane 604. For example, the project pane 604 may contain a list of entries where each entry is a test model.

The test model 600 may include one or more objects adapted to drive the external inputs of the design model 300 (FIG. 3), one or more objects adapted to receive external outputs of the design model 300, for example for logging or verification purposes, and one or more objects for specifying values to the design model's initialization states, parameters, and control signals. Specifically, the test model 600 includes a Signal Builder block 612 that is connected to a subsystem block 614, which represents the design model 300, and three verification blocks 616, 618, 620. Just like the design model 300, the subsystem block 614 has two inputs (In1 and In2) 622*a*, 622*b*, and three outputs (Out1, Out2, and Out3) 624*a-c*. The Signal Builder block 612 is a source block that is used to create one or more groups of time-varying signals. The Signal Builder block 612 provides two signals (Signal 1 and Signal 2) 626*a*, 626*b* that are connected to the inputs (In1 and In2) 622*a*, 622*b* of the subsystem block 614 for providing input test signals. The outputs (Out1, Out2, and Out3) 624*a-c* of the subsystem block 614 are connected to the verification blocks 616, 618, 620. The first verification block 616 is adapted to perform a upper bound check on a first external output signal 628*a* of the subsystem block 614.

The second verification block 618 is adapted to perform a range check on the second external output signal 628b, and the third verification block 620 is adapted to check whether the third external output signal 628c is asserted.

Figure 7:
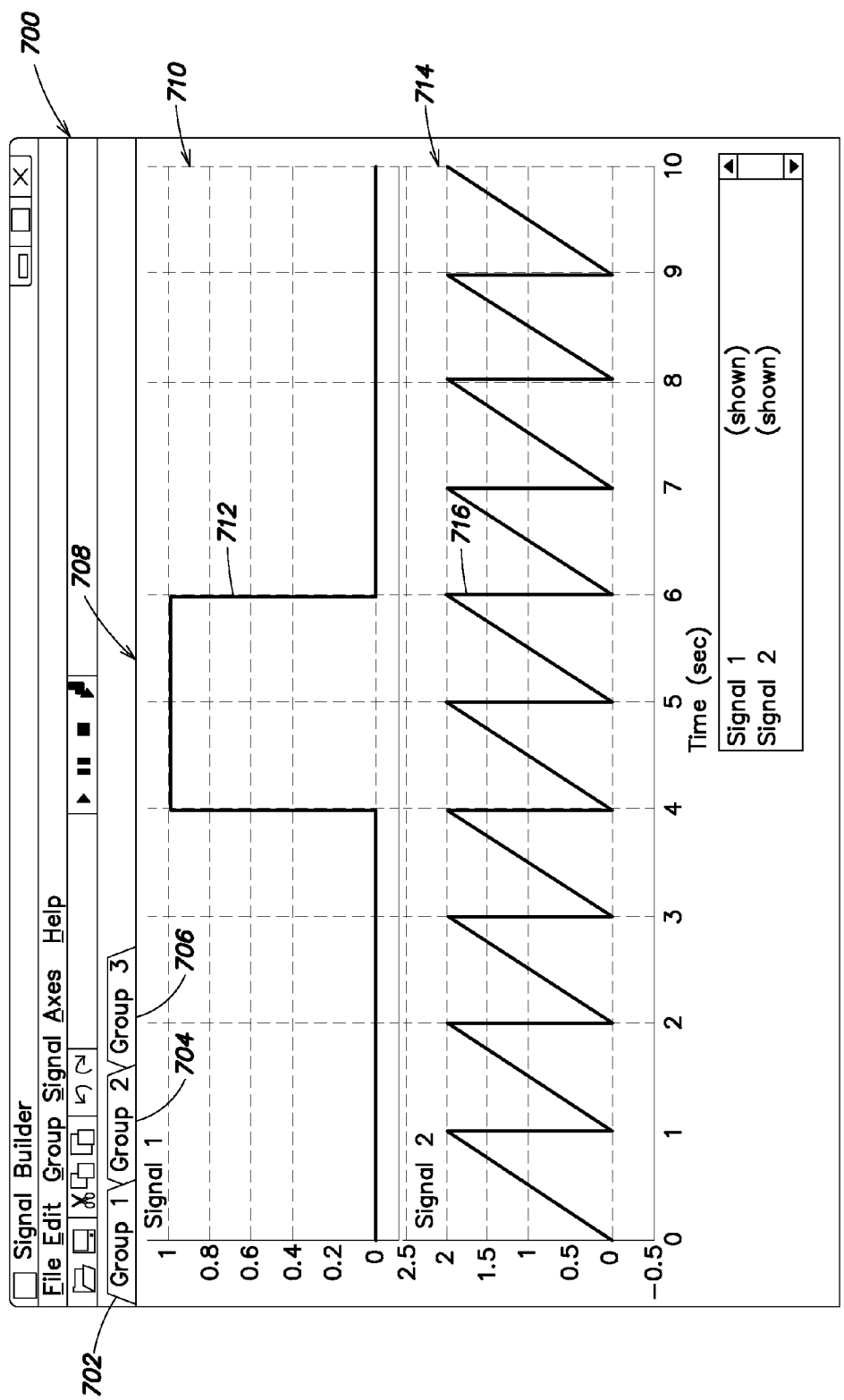
FIG. 7 is an illustration of a configuration window for a source component of the test model of FIG. 6.

FIG. 7 is a schematic illustration of a configuration window 700 for the Signal Builder block 612. The configuration window 700 includes a series of tabs, such as tabs 702, 704, 706, and each tab 702, 704, 706 corresponds to a respective group of signals defined by the Signal Builder block 612. The signals defined for a selected group, such as 'Group 1,' tab 702, are presented in a signal group pane 708, which may contain a configurable waveform designer for each signal in the group. As shown, the first signal (signal 1) of 'Group 1' is defined in a first waveform designer 710 as a step signal 712. The second signal (signal 2) of 'Group 1' is defined in a second waveform designer 714 as a triangle wave 716 whose amplitude ranges from '0' to '2'. The other Groups may be define different waveforms for the output signals (signal 1 and signal 2) of the signal builder block 612, such as other step or triangle waves, constant values, ramp signals, square waves, etc.

Suppose a proposed change is received to the interface specification 400, and that the proposed change is to add a new Inport block to the design model 300, and to connect this new Inport block to a new input defined for the subsystem block 326. The broker 232 may identify the test models that are associated with the design model 300, and a determine a corresponding change to be made to these test models in order to keep the test models consistent with the design model 300 following the proposed change. Regarding the test model 600, the broker 232 determines that the Signal Builder block 612 provides test signals to the external inputs of the design model 300, as represented in the test model 600 by the subsystem block 614. In order to keep the test model 600 consistent with the design model 300 following the proposed change, the broker 232 may determine that the test model 600 should be changed by adding new output to the Signal Builder block 612, and connecting this new output to the new Inport block being added to the design model 300. The broker 232 may also determine the updates that are to be made to the interface specification 400. The broker 232 may then modify the design model 300, the test model 600, and the interface specification 400 as an atomic transaction. It should be understood that the broker 232 may alternatively control other entities that modify the design model and the test models.

In another embodiment, the broker 232 may determine that one or more new components should be added to the test models, such as a new Signal Builder or other source block.

Figure 8:
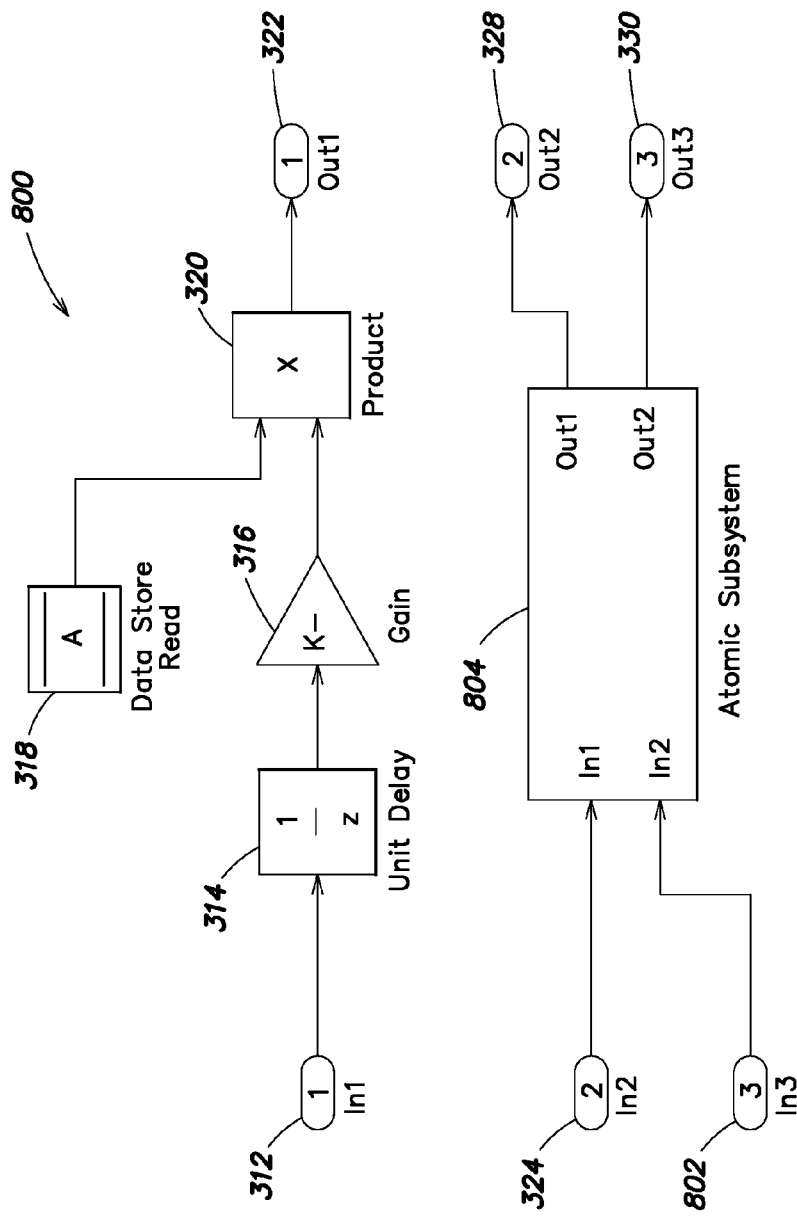
FIG. 8 is a modified version of the graphical design model of FIG. 3.

FIG. 8 is a schematic illustration of a design model 800 as modified by the proposed change. The modified design model 800 includes a new Inport block 802 that is connected to a new input (In2) of a modified subsystem block 804. Because the new input 'In2' of the subsystem block 804 represents an internal input of the design model 800, no corresponding change needs to be made to the test models.

Figure 9:
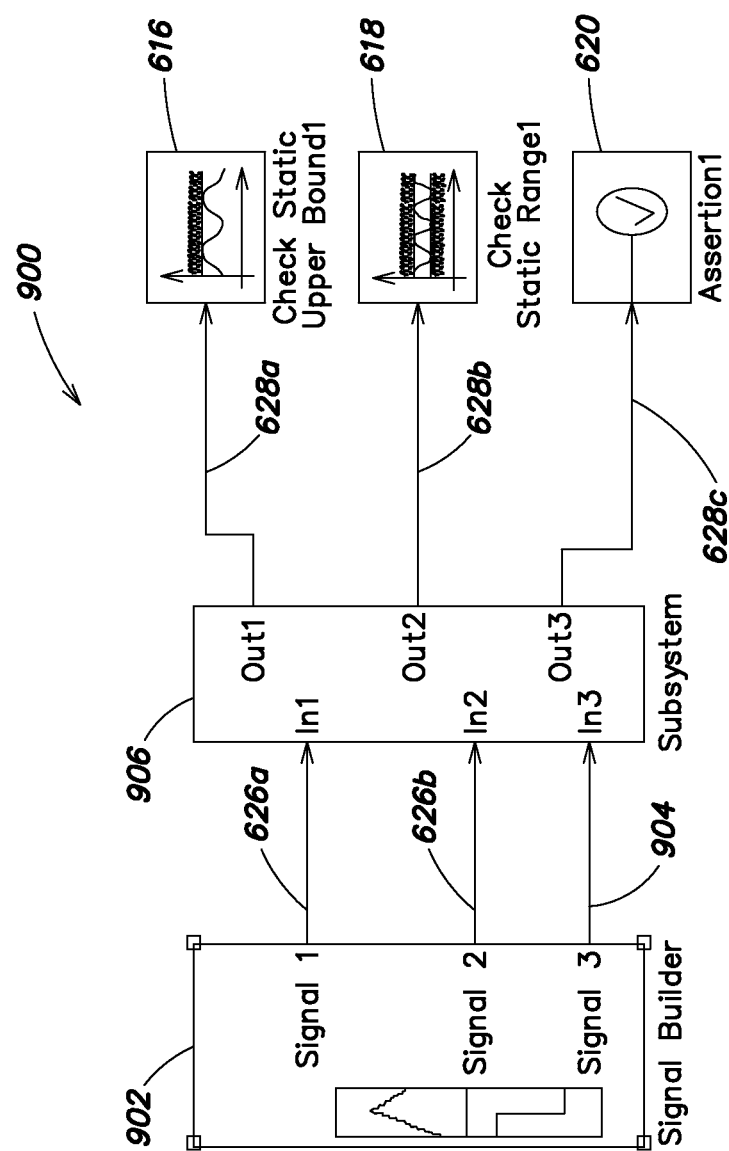
FIG. 9 is a modified version of the test model of FIG. 6.

FIG. 9 is a schematic illustration of a test model 900 as modified to maintain consistency with the changed design model 800. The modified test model 900 includes a Signal Builder block 902 modified to have a new output signal (Signal 3) 904 that is connected to a new input (In3) of a modified subsystem block 906, representing the modified design model 800.

Figure 10:
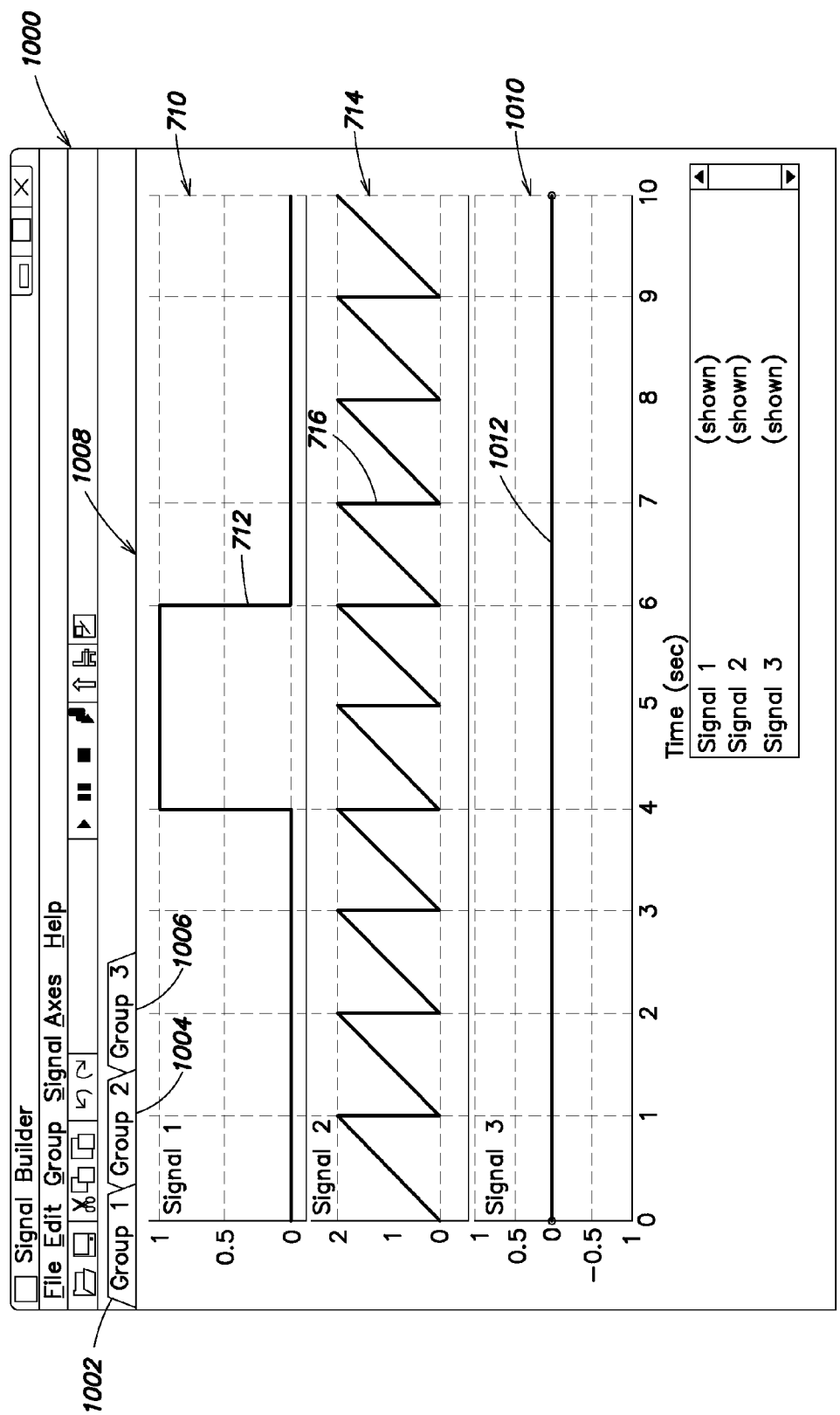
FIG. 10 is an illustration of a configuration window for a modified version of the source component of FIG. 7.

In addition to adding the new output port 904 for the Signal Builder block 902 of the modified test model 900, the broker 232 also may modify each group of signals defined by the Signal Builder block 902 automatically to specify a signal value for the new output. FIG. 10 is a schematic illustration of a configuration window 1000 for the modified Signal Builder block 902. The configuration window 1000 includes tabs 1002, 1004, 1006 for the three signal groups ('Group 1', 'Group 2', 'Group 3') defined by the Signal Builder block 902. A signal group pane 1008 shows the signals for the selected tab, e.g., tab 1002 '(Group 1).' The broker 232, however, has modified all of the signal groups automatically to include a new signal (Signal 3 ) that is provided on the block's new output signal 904. Specifically, the configuration window 1000 includes a third waveform designer 1010 within the signal group pane 1008. The broker 232 may be adapted to define automatically a default signal profile value for such added signals. For example, the broker 232 may be adapted to set the value of the new signal at a constant value of, e.g., zero. Accordingly, the third waveform designer 1010 displays a constant signal 1012.

In other embodiments, the default signal value applied to new signals may be user specified. For example, for a given design model, a user may specify that newly added signals have a value '1' or some other value.

Figure 11:
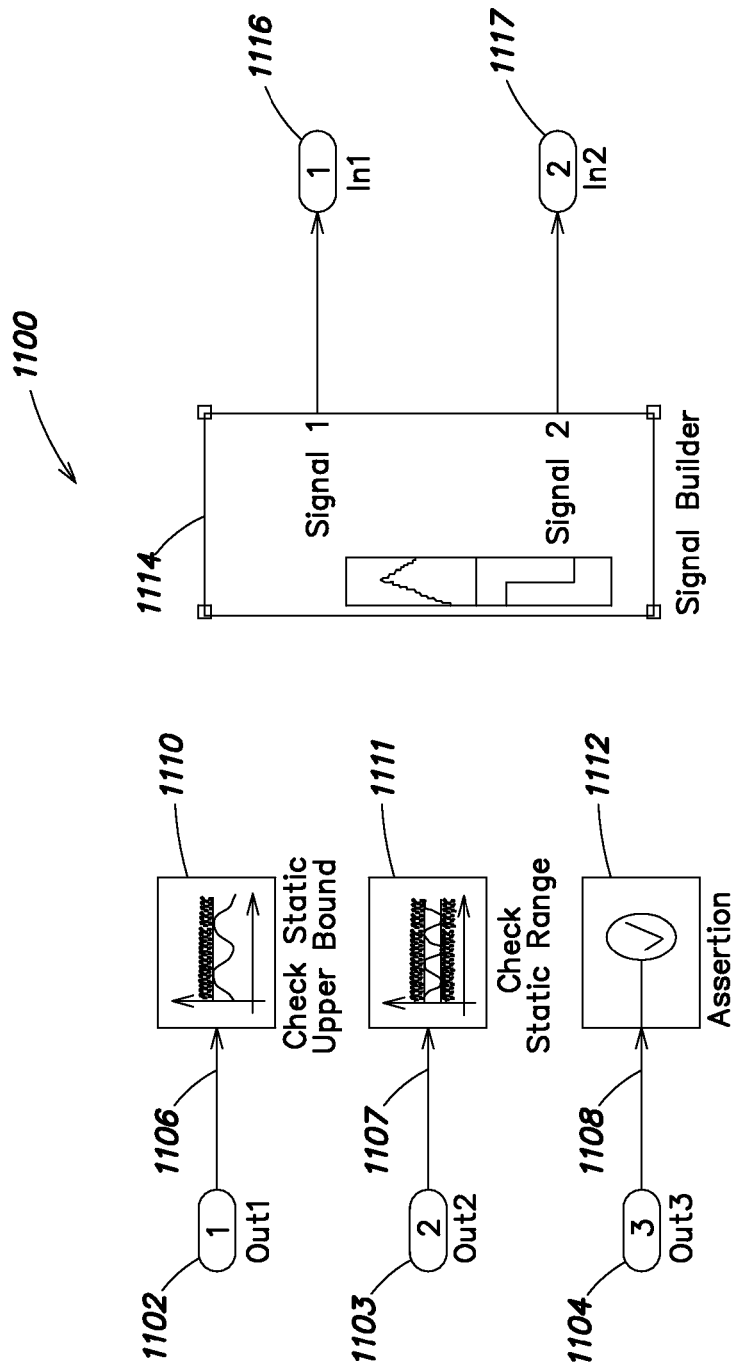
FIG. 11 is an illustration of a test model in accordance with another embodiment of the present invention.

Other test models or tests may be created manually or automatically for the design model 300. For example, an open loop test model may be created. FIG. 11 is a schematic illustration of an exemplary open loop test model 1100. The open loop test model 1100 may include one or more inputs, such as Inport blocks 1102-1104. Each Inport block 1102-1104 may be linked to a respective external output of the design model 300. The inputs of the open loop test model 1100 may be connected to one or more logging or verification objects. For example, the Inport blocks 1102-1104 may be connected, e.g., by signal lines 1106-1108, to verification blocks 1110-1112, respectively. The open loop test model 1100 also may include one or more source blocks, such as a Signal Builder block 114, connected to one or more outputs, such as Outport blocks 1116, 1117. The Outport blocks 1116, 1117 may be linked to the external inputs of the design model 300. The open loop test model 1100 may not include an object representing the design model 300.

Figure 12:
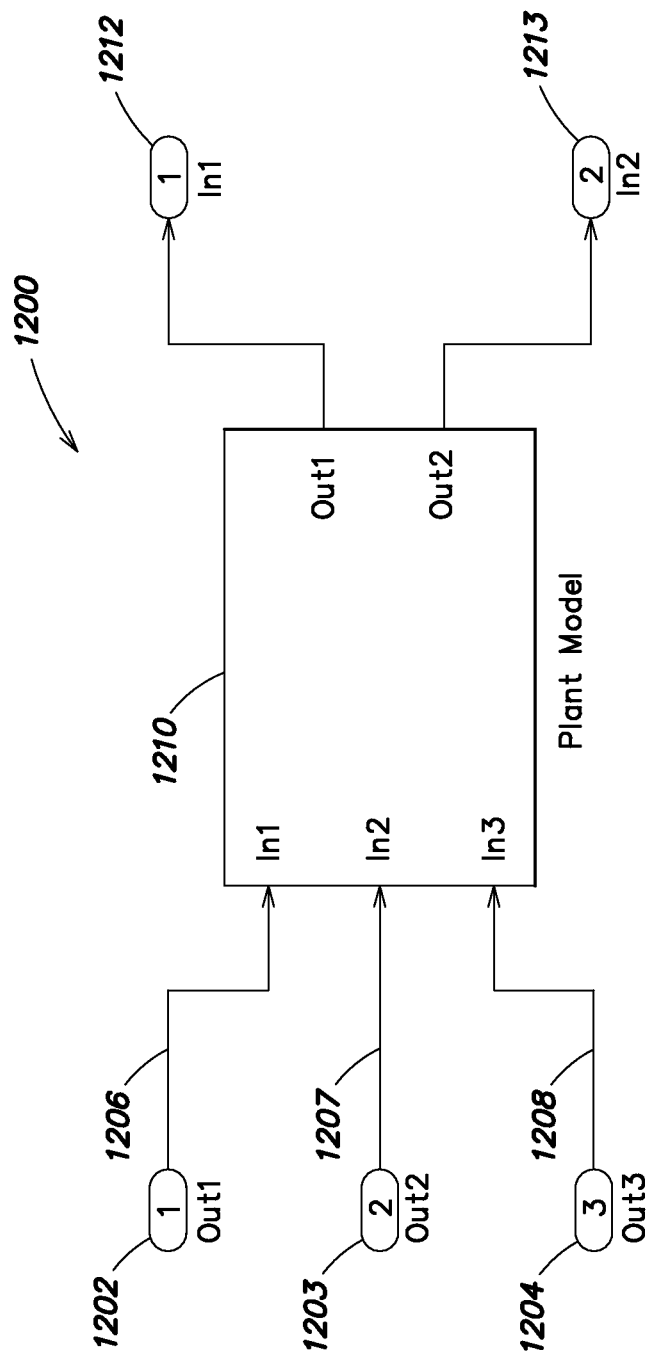
FIG. 12 is an illustration of a test model in accordance with another embodiment of the present invention.

Another type of test model is a closed loop test model. FIG. 12 is a schematic illustration of a closed loop test model 1200. The closed loop test model 1200 may include a plurality of inputs, such as Inport blocks 1202-1204 that may be linked to respective external outputs of the design models 300. The inputs may be connected to one or more test model objects of the closed loop test model 1200. For example, the Inport blocks 1202-1204 may be connected, e.g., by signal lines 1206-1208 to one or more subsystem blocks, such as a first subsystem block 1210. The first subsystem block 1210 may be a plant subsystem block, and may be configured to model the operation of a plant, such as a manufacturing plant or other physical plant. The plant model subsystem block 1210 may have one or more outputs that are connected to outputs of the closed loop model 1200. More specifically, the plant model subsystem block 1210 may have two outputs that are connected to two Outport blocks 1212, 1213. The Outport blocks 1212, 1213 may be linked to respective external inputs of the design model 300. The closed loop test model 1200 may not include any object representing the design model 300.

Another type of test model may be or may include a Human Machine Interface (HMI) that is linked to a design model. The HMI may be opened or constructed, for example by a user or other developer interacting with a graphical user interface (GUI) builder tool. The GUI builder tool may include one or more libraries having GUI elements, such as buttons, displays, etc., that may be selected and used to construct a particular HMI. A suitable GUI builder tool is the Gauges Blockset software tool from The MathWorks, Inc.

Figure 13:
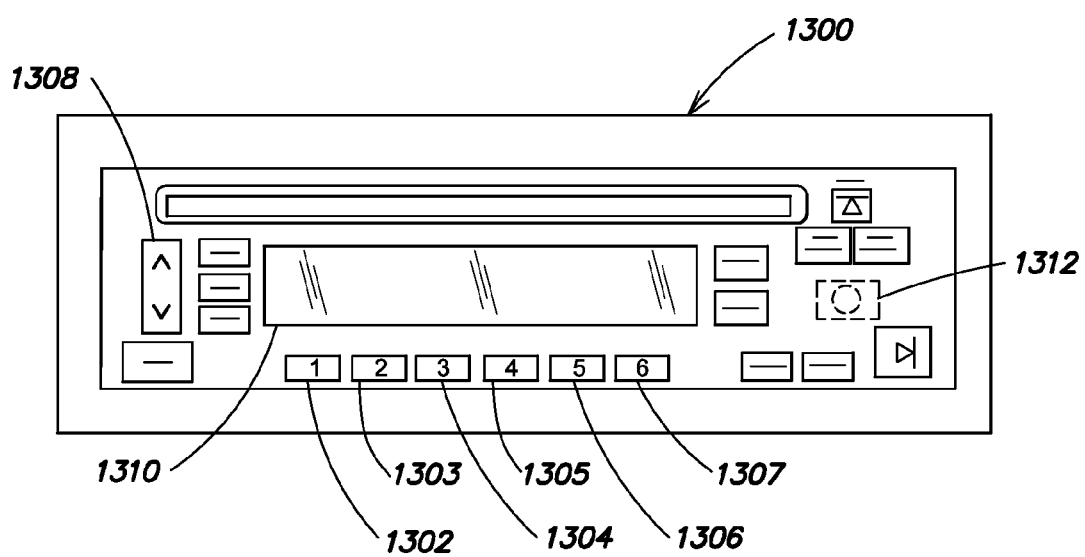
FIG. 13 is an illustration of a Human Machine Interface (HMI) test model in accordance with an embodiment of the present invention.

FIG. 13 is a schematic illustration of a graphical HMI test model 1300. The HMI test model 1300 may be linked to a design model (not shown). The HMI 1300 may model the user interface of a system under design or test, such as a car radio or audio system. The design model may model the operation of the car radio or audio system. The HMI 1300 may include one or more input buttons, and one or more display elements. Specifically, the HMI 1300 may include a plurality of station preset buttons 1302-1307, and a volume control button 1308, among others. The HMI 1300 also may include a multi-line digital display element 1310. Each input button 1302-1308 of the HMI 1300 may be linked to an external input of the design model. In an embodiment, one or more of the input buttons 1302-1308 may be operated by a user, such as a test engineer, e.g., with a mouse or a touch screen on which the HMI 1300 may be displayed. In addition, each display element of the HMI 1300, such as multi-line digital display element 1310, may be linked to an external output of the design model.

One or more test specifications may be created for the HMI 1300. The test specifications may specify a sequence of button presses. To run the test, a test engineer may press the input buttons 1302-1308 of the HMI 1300 in the sequence specified by the test specification. The test specification may also specify the expected output that is to be presented on the multi-line digital display element 1310 of the HMI 1300. During the test, the test engineer may record or monitor the data or information presented on the multi-line digital display element 1310 of the HMI 1300. The test model that includes the HMI 1300 also may include one or more objects or components adapted to log the button presses entered by the test engineer during the test. Accordingly, if an unexpected output is presented on the multi-line digital display element 1310 of the HMI 1300, or some other unexpected result occurs during the test, the test engineer may stop the test, and examine the log of button presses. This examination may lead to the creation of one or more additional test sequences in order to track down the cause of the unexpected output or error condition.

In another embodiment, the test model that includes the HMI 1300 may be adapted to perform one or more sequences of button presses automatically. For example, the test model may include a test script that calls for a sequence of button presses to be performed. In this case, a test engineer may monitor the sequence of button presses as they occur during the test. That is, as each button press occurs, the respective button on the HMI 1300 may change appearance briefly. For example, the button may briefly change color, intensity, etc. The test engineer may also monitor or record the data or other information presented on the multi-line digital display element 1310. If an error or other unexpected occurrence is detected, the test engineer may suspend the test, examine the log or other components, and define further testing of the HMI 1300 and/or the design model.

As with other test models, the broker 232 may construct an interface specification for the design model and the HMI 1300. If a change is proposed to the interface specification, the broker 232 may determine the corresponding change to be made to the HMI 1300. For example, suppose a new external input is added to the design model. The broker 232 may determine that a new input button needs to be added to the HMI 1300. Furthermore, the addition of the new external input to the design model and the addition of the new input button to the HMI 1300 may be performed atomically. The HMI 1300 and/or the test model that includes the HMI 1300 may specify one or more functions to be called in response to particular proposed changes to the interface specification. For example, the function may call for an input button having a default format to be placed in a default location on the HMI 1300. In addition, the function may call for a message or a warning to be presented, e.g., displayed, to the user. The message or warning may notify the user that a change to the HMI 1300 has been made that requires further input from the user. An exemplary message is "New Layout Required". The message may be designed to cause the user may modify the format, appearance, and/or location of the newly added button to the HMI 1300 to a desired format, appearance, and/or location.

For example, if a new external input is added to the design model linked to the HMI 1300, the broker 232 may cause a new button to be added to the HMI 1300, such as new button 1312, which is shown in dashed outline.

Distributed Environment

Figure 14:
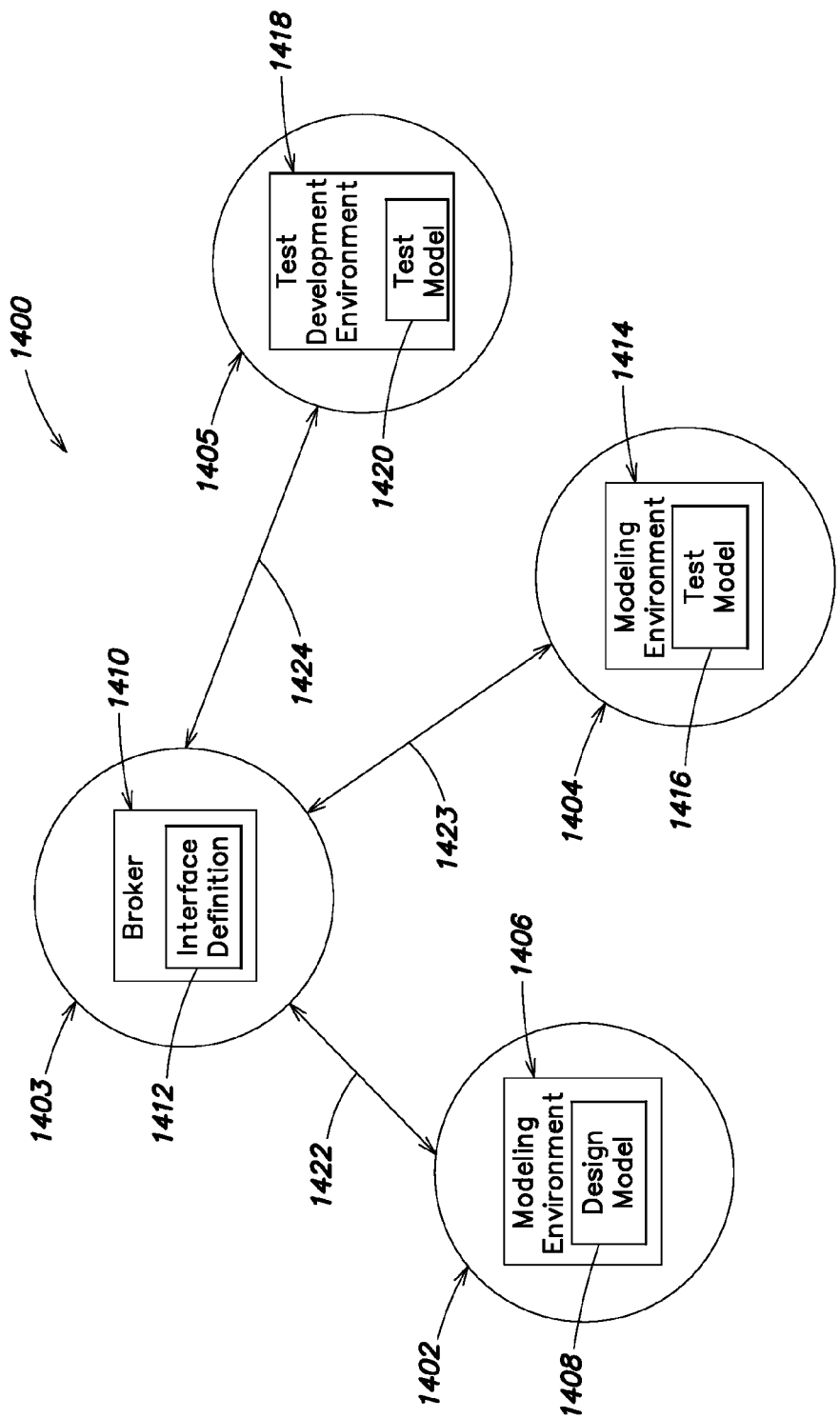
FIG. 14 is a schematic illustration of a distributed computing environment in accordance with an embodiment of the present invention.

In addition to being implemented on a single data processing device, such as a workstation, the present invention may be implemented in a distributed environment or architecture. FIG. 14 is a schematic illustration of the present invention implemented as a distributed system 1400. In the embodiment of the distributed system 1400, components of the present invention are located, e.g., running, on separate nodes, such as separate workstations or servers that are in communicating relationship with each other.

The distributed system 1400 may include a plurality of nodes, such as nodes 1402-1405. Each node 1402-1405 may be a separate data processing device, such as a workstation, a server, etc., and may include some or all of the elements of the data processing system 100 (FIG. 1). The first node 1402 may include a modeling environment 1406 that may be used to open or construct a design model 1408. The second node 1403 may include a broker 1410 that controls an interface definition 1412 created for the design model 1408. The third node 1404 may include a modeling environment 1414 in which a test model 1416 may be opened and/or constructed. The fourth node 1405 may include a test development environment 1418 in which a test model 1420 may be opened and/or constructed. Local agents (not shown) of the broker 1410 may also be running on the first, third and fourth nodes 1402, 1404, 1405.

The modeling environments 1406, 1414 running on the first and third nodes 1402, 1404 may be separate instances of the same type of modeling environment or they may be different modeling environments. The design model 1408, the test model 1416, and the test model 1420 may register with the broker 1410 to receive notifications concerning proposed changes to the interface definition 1412.

The first, third and fourth nodes 1402, 1404, 1405 may be operatively coupled to the second node 1403 that hosts the broker 1410, as indicated by bi-directional arrows 1422-1424. The arrows 1422-1424 represent communication links or channels among the respective nodes. Suitable communication channels include one or more virtual private networks (VPNs) overlaid on a communication network, such as a Local Area Network (LAN), Wide Area Network (WAN), and/or the Internet. The first, third and fourth nodes 1402, 1404, 1405 may not be in communicating relationship with each other. Indeed, the first and second modeling environments 1406, 1414 and the test development environment 1418 may not even be aware of each other. In another embodiment, the first, third and fourth nodes 1402, 1404, 1405 may be in communicating relationship with each other.

Suppose a proposed change to the design model's interface is made through the first modeling environment 1406 at the first node 1402. This proposed change may be captured by the local broker agent, and transmitted to the broker 1410 at the second node 1403. The broker 1410 may determine that the test model 1416 and the test model 1420 have registered as listeners to changes to the interface definition 1412. Accordingly, the broker 1410 may generate and transmit one or more notification messages to the third and fourth nodes 1404, 1405. The local broker agents at the third and fourth nodes 1404, 1405 may receive these notification messages, and may call respective functions on the test model 1416 and the test model 1420 so that they remain consistent with the design model 1408 as changed.

The local broker agents may be adapted to ensure that the changes take place at all of the design model 1408, the test model 1416, and the test model 1420, or that none of them are changed. Suitable techniques for enforcing such updates include database protocols, such as the Two Phase Commit protocol.

In an embodiment, the interface definition 1412 may refer to a standard, such as the standard defining the Bluetooth wireless data exchange protocol. Accordingly, tests may be defined that demonstrate compliance with the Bluetooth protocol.

In an embodiment, multiple users may create tests for the same design model simultaneously or sequentially. The users may be working in different locations. Nonetheless, the creation and revision of test models does not disturb, e.g., modify or change, the design model.

Software in the Loop (SiL)/Processor in the Loop (PIL)

As noted, the design model 300 and the test model 600 may be executed on a workstation, such as a desktop or laptop PC. In another embodiment, the design model 300 may be executed in a Software in the Loop (SiL) mode or Processor in the Loop (PIL) mode. More specifically, the code generator 240 may be operated to generate code for the design model 300. In addition, and the generated code may be compiled by the target language compiler 242. The compiled code may be loaded and executed on a target hardware device, such as a digital signal processor (DSP), a microprocessor, etc. Furthermore, the target device may be coupled to the workstation through a communication channel, such as an Ethernet port, a serial or parallel port, a USB port, a wireless connection, etc. The test model may be executed on the workstation, for example by the simulation engine 206, while the code generated from the design model 300 may be executed by the target device. Using the communication channel, the test model 600 may drive the external inputs of the design model 300, as executed by the target device, and receive the external outputs for logging and/or criteria testing.

For example, C code may be automatically generated for the design model 300 that can be executed in real-time. For example, the C code may be compiled into one or more shared libraries such as one or more dynamic link libraries (DLLs). The one or more DLLs may be executed on a microprocessor running a real-time operating system, such as the Windows CE (also known as Windows Embedded Compact) operating system.

In another embodiment, the code generator 240 may be operated to generate code complying with a Hardware Description Language (HDL). The generated HDL code may be used to configure a programmable hardware device, such as a Field Programmable Gate Array (FPGA). For example, one or more synthesis tools may receive the HDL and configure an FPGA for hardware accelerated simulation or reconfigurable input/output signal conditioning. The FPGA may be coupled to the workstation through a communication channel. In this embodiment, the test model 600 may be executed on the workstation, while the design model 300 may be executed by the FPGA.

In a further embodiment, HDL code may also be generated for some or all of the components of the test model 600, and used to further configure the FPGA to execute some or all of the test model in addition to the design model 300. In a first embodiment, HDL may be generated for the non-source and non-sink blocks of the test model 600, and used to configure the programmable logic to implement the non-source and non-sink blocks. In another embodiment, HDL may be generated for the source and/or sink blocks as well. For example, information to construct input signals may be stored in one or more look-up tables implemented on the FPGA, depending on its size. Suitable devices for performing hardware in the loop testing include the CompactRIO series of devices from National Instruments, Inc.

In an embodiment, the test models constructed for the design model 300 in the modeling environment 200 may be re-used when the design model 300 is implemented in target hardware, such as on a microprocessor or an FPGA. Suitable tools for re-using the test models include the Embedded Targets provided by Embedded Coder from The MathWorks, Inc.

Modeling Environment

Figure 15:
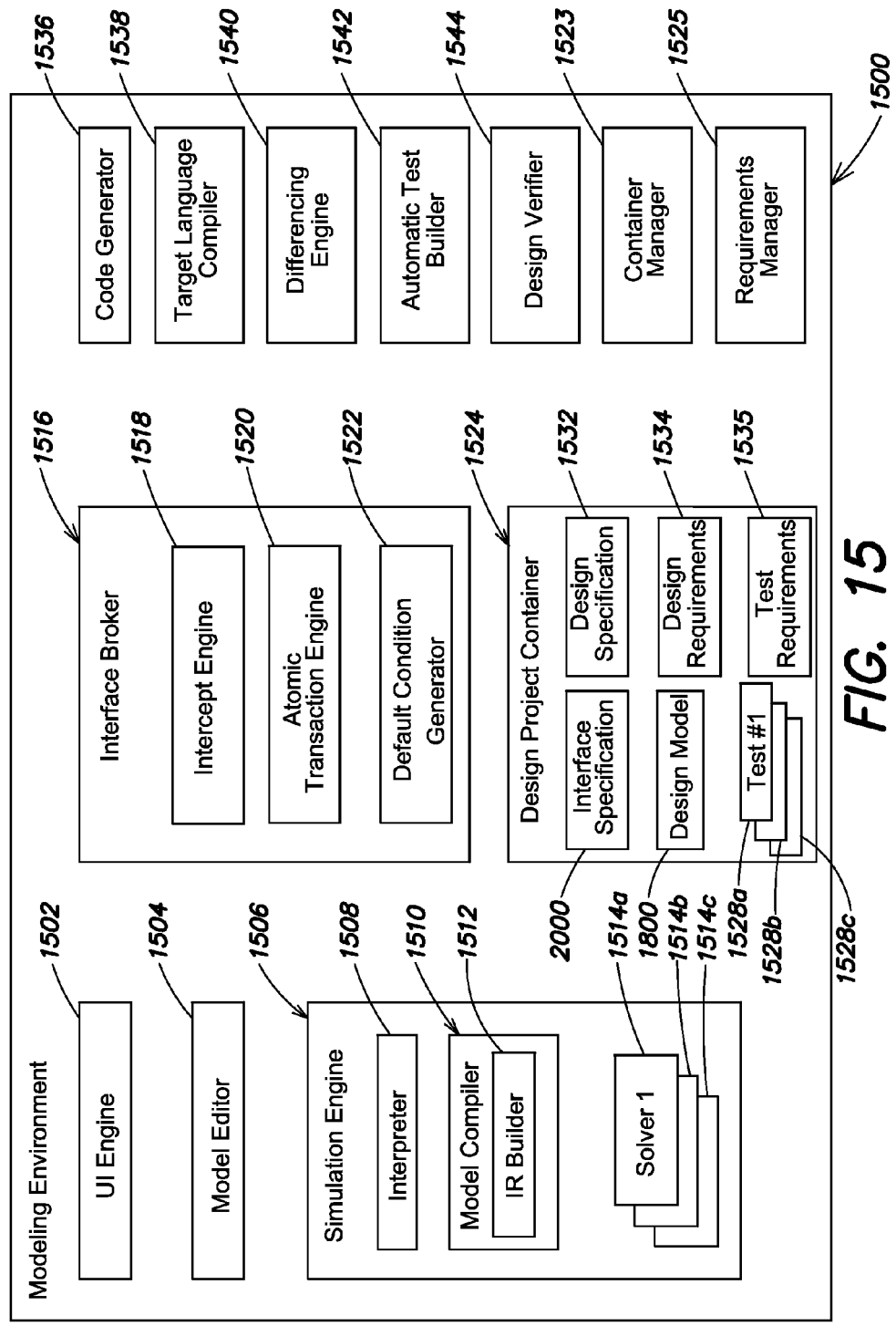
FIG. 15 is a partial functional diagram of a modeling environment in accordance with an embodiment of the present invention.

FIG. 15 is partial, functional diagram of another embodiment of a modeling environment 1500. The modeling environment 1500 may include a user interface (UI) engine 1502, a model editor 1504, and a simulation engine 1506. The simulation engine 1506 may include an interpreter 1508, a model compiler 1510 that, in turn, may include one or more Intermediate Representation (IR) builders, such as IR builder 1512, and one or more of solvers, such as solvers 1514*a-c*. The UI engine 1502 may be configured to create and present one or more user interfaces, such as Graphical User Interfaces (GUIs), that may be operated by users to perform various tasks, such as opening, creating and saving graphical models, opening, creating and saving textually specified programs, etc. The model editor 1504 may be configured to construct one or more graphical models, such as one or more design models and/or test models. The simulation engine 1506 may be used to simulate, e.g., execute or run, the graphical models using one or more of the solvers 1514.

The modeling environment 1500 may further include an interface broker 1516. The interface broker 1516 may include an intercept engine 1518, an atomic transaction engine 1520, and a default condition generator 1522. The broker 1516 may be configured to construct and maintain one or more interface specifications.

The modeling environment 1500 may also include a container manager 1523 and a requirements manager 1525, and may further include or have access to one or more design project containers, such as design project container 1524. The container manager 1523 may be configured to create and manage containers that hold or store objects. For example, the container manager 1523 may create the design project container 1524, and may load a plurality of objects into the design project container 1524. In particular, the design project container 1524 may include a design model 1800, one or more tests for the design model 1800, such as tests 1528*a-c*, an interface specification 2000, a design specification 1532, a design requirements 1534, and a test requirements 1535. The design specification 1532, the design requirements 1534 and the test requirements 1535 may be documents. The container 1524 may include other or different objects.

As described herein, the design model 1800 may be a graphical model having executable semantics. The design model 1800 may represent a system or a part of a system, such as a controller, being constructed, edited and/or evaluated by a user, such as a designer. The tests 1528a-c may be test specifications, test harnesses, etc. used to evaluate the design model 1800. The first test 1528a, for example, may be a graphical test model having executable semantics. The second test 1528b may be a textually specified program or script that, when executed, performs one or more tests on the design model 1800. The third test 1528c may be a data driven test, such as a set of data used to test the design model 1800. The set of data may include input data values to be processed by the design model 1800, and output data values or ranges to be evaluated against outputs actually generated by the design model 1800 as it processes the input data values.

It should be understood that other forms of tests may be created and included in the design project container 1524. For example, another test may be based on the test model 1528b but apply different model parameters to the test model 1528b. That is, a first test case may include the test model 1528b with set 'X' of test model parameters, while a second test case may include the test model 1528b with set 'Y' of test model parameters. Furthermore, a test harness may be defined that includes a reference to the design model 1800 and a reference to a test model. Alternative tests may be created by substituting different test models in the test harness.

The set of data of the data driven test 1528c may include input and output signal traces, and may be generated or obtained in a number of different ways. For example, the set of data may be obtained by testing a real-world, e.g., a physical, component in a laboratory or out in the field. The set of data also may be generated or obtained during one or more simulations of the design model 1800 or other models, such as other versions of the design model 1800. More specifically, a model may be instrumented in order to log data generated during the simulation of the model. This logged data may be saved and used as a data driven test for the design model 1800. The instrumented model may be a top or parent model that includes the design model 1800 or a version of the design model.

The modeling environment 1500 may include other components, such as a code generator 1536, a target language compiler 1538, a differencing engine 1540, an automatic test builder 1542, and a design verifier 1544. The code generator 1536 may be configured to generate computer programming code, such as source and/or object code, from a model. The target language compiler 1538 may be configured to compile source code, such as source code generated by the code generator 1536, for execution by target platform or target hardware. The differencing engine 1540 may be configured to analyze two models, and generate a report that describes the differences between the two models. The automatic test builder 1542 may be configured to construct a test for a design model automatically. The design verifier 1544 may be configured to evaluate a graphical model, and identify design errors in the model. Exemplary design errors that may be detected include dead logic, integer overflow, division by zero, and violations of design properties and assertions. The design verifier 1544 also may generate test vectors for portions of the model found to have errors. The test vectors may reproduce the errors during simulation of the model.

Suitable design verifiers include the Simulink Design Verifier tool from The MathWorks, Inc.

The broker 1516, the container manager 1523, the requirements manager 1525 and the automatic test builder 1542 as well as other components of the modeling environment 1500 may each comprise registers and combinational logic configured and arranged to produce sequential logic circuits. In an embodiment, the broker 1516, the container manager 1523, the requirements manager 1525 and the automatic test builder 1542 may be implemented through one or more software modules or libraries containing program instructions pertaining to the methods described herein. The software modules may be stored on main memory 104 and/or computer readable media, such as computer readable medium 126, and executable by one or more processing elements, such as processing element 102. Other computer readable media may also be used to store and execute these program instructions. In alternative embodiments, various combinations of software and hardware, including firmware, may be utilized to implement the present invention.

The design project container 1524 may be implemented as an Open XML Specification (OpenXPS) document created using Open Packaging Conventions (OPC). Alternatively, the container 1524 may be implemented using a compression utility, such as a zip utility. The design model 1800 and the tests 1528 may be implemented through files, tables, trees, or other data structures or objects. The design project container 1524, which itself may be an object, may be stored on main memory 104, persistent memory 108, and/or medium 126.

Figure 16A:
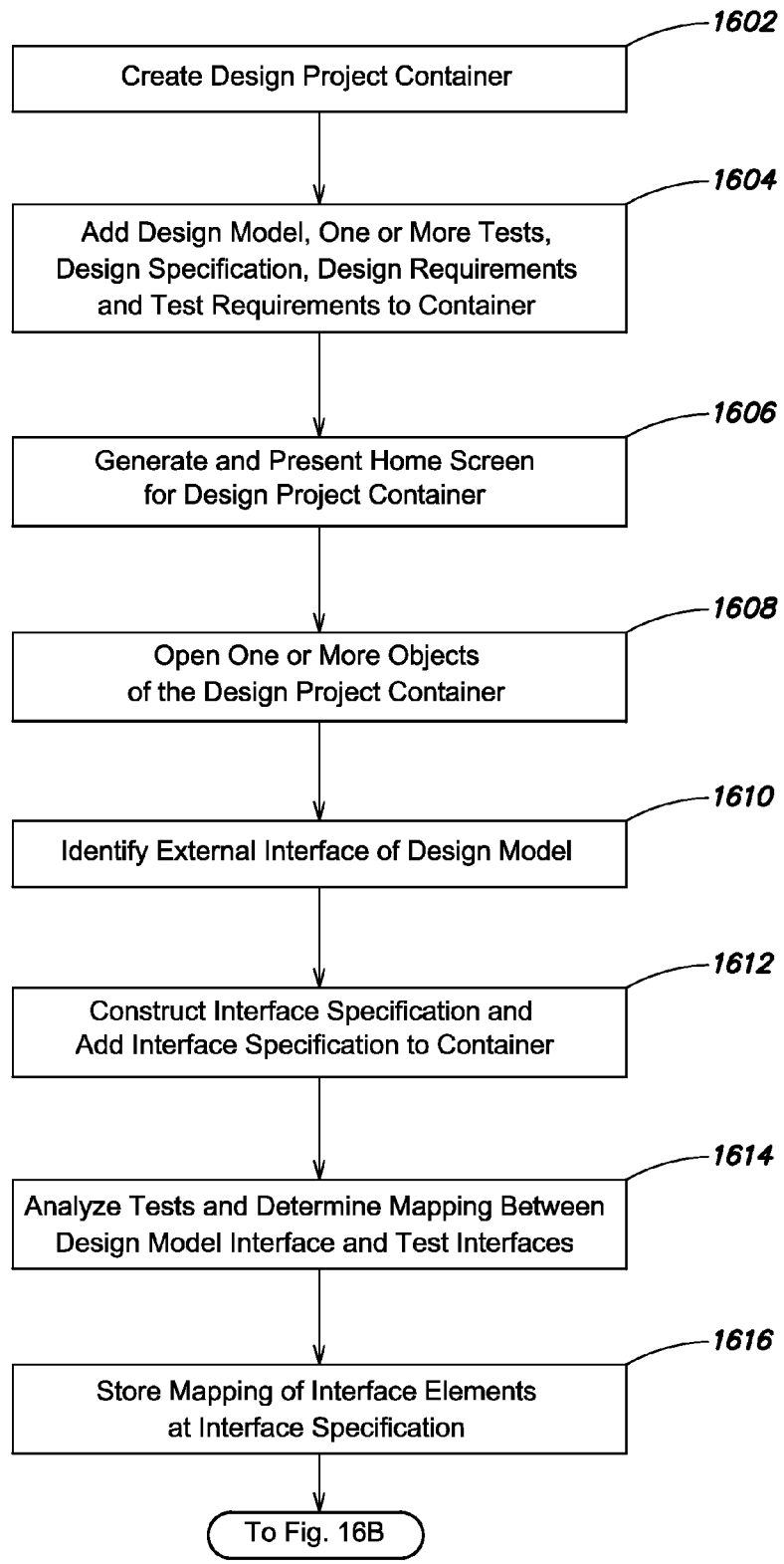
FIGS. 16A and B is a flow diagram of a method in accordance with an embodiment of the present invention.

FIGS. 16A and B is a flow diagram of a method in accordance with an embodiment of the invention. The broker 1516 may construct a design project container, such as the container 1524, for a given project, as indicated at block 1602. The broker 1516 may add one or more objects to the container 1524 as selected by a user, such as a design model, one or more tests, a design specification, design requirements and test requirements, as indicated at block 1604. The broker 1516 may also add an interface specification created by the broker 1516 to the container 1524, as described herein. The UI engine 1502 may create a user interface, such as a GUI, that represents a home screen or home page for the design project container, as indicated at block 1606.

Figure 17:
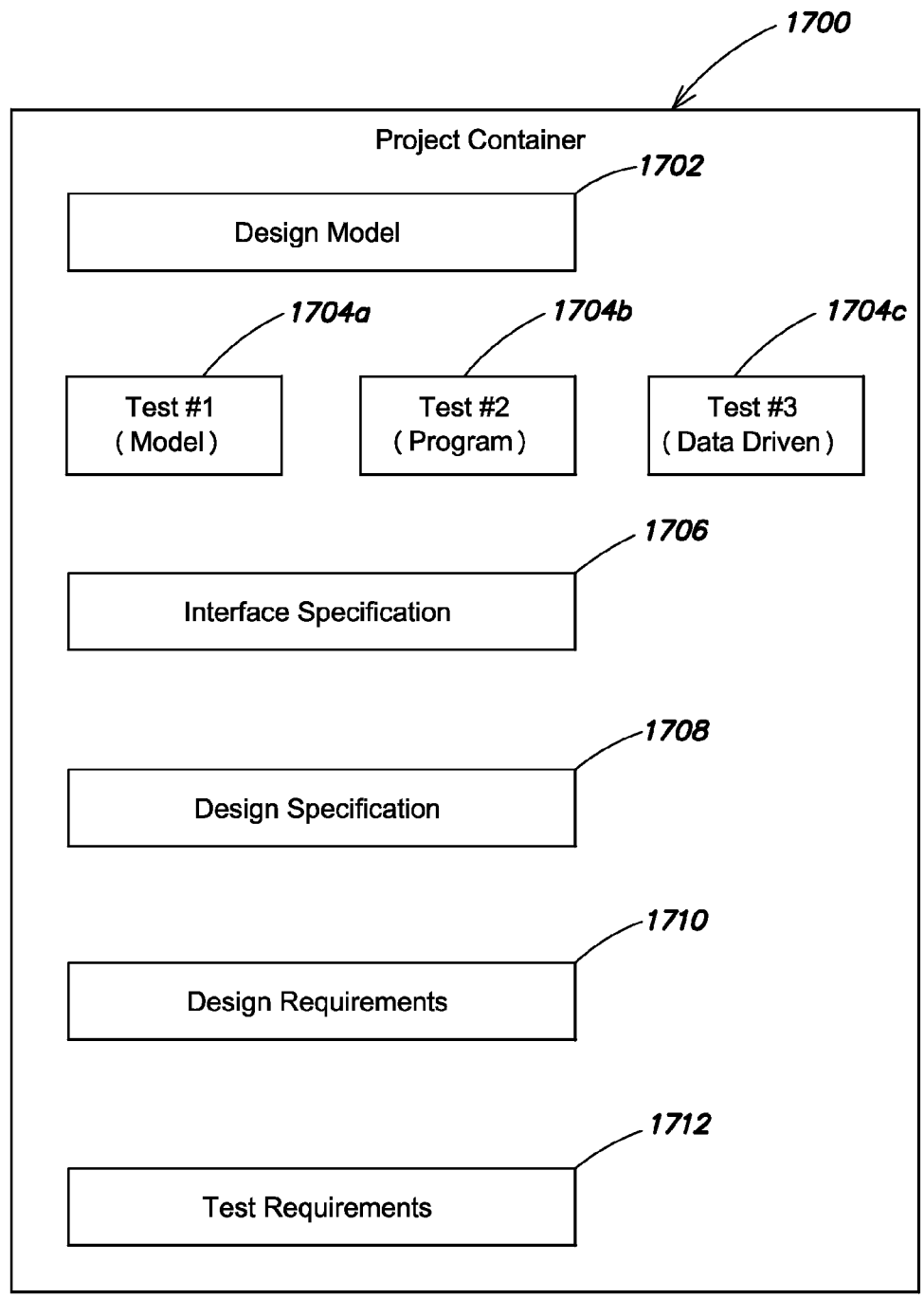
FIG. 17 is a schematic illustration of a home screen for a design project container in accordance with an embodiment of the present invention.

FIG. 17 is a schematic illustration of a user interface, such as a graphical user interface (GUI), that represents a home page 1700 for the design project container 1524. The home page 1700 may be presented on the display 120 of the workstation 100. The home page 1700 may be configured to provide access to at least some, and preferably all, of the objects, stored within the respective container 1524. For example, the home page 1700 may include a plurality of command buttons or links, such as hyperlinks, through which a user may access the objects of the container 1524. In particular, the home page 1700 may include a design model button 1702 for accessing the design model 1800, one or more test buttons 1704a-c for accessing the tests 1528a-c, an interface specification button 1706 for accessing the interface specification 2000, a design specification button 1708 for accessing the design specification 1532, a design requirements button 1710 for accessing the design requirements 1534 and a test requirements button 1712 for accessing the test requirements 1535.

The command buttons may be in the form of thumbnail images of the respective objects. For example, the design model button 1702 may be a thumbnail image of the design model 1800.

One or more of the objects of the design project container 1524 may be opened, as indicated at block 1608. To open an object, a user may select the respective command button on the home page 1700, e.g., with the mouse 118. To open the design model 1800, e.g., for editing or simulation, the user may select the design model button 1702.

Figure 18:
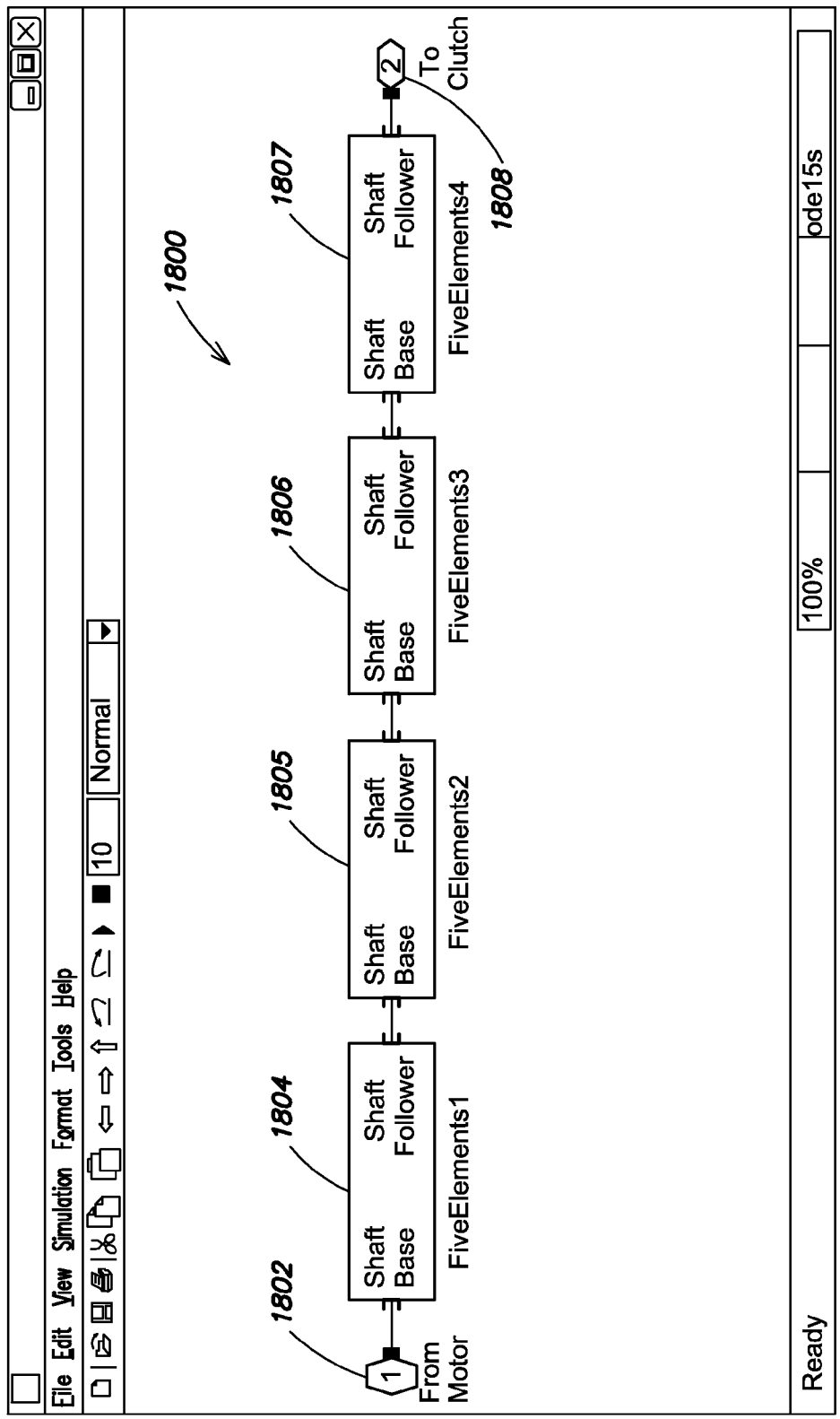
FIG. 18 is an illustration of a graphical design model having executable semantics in accordance with an embodiment of the present invention.

FIG. 18 is a schematic illustration of the computer-generated graphical model 1800. The graphical model 1800 may be a block diagram model. The graphical model 1800 may represent a model of a car drive shaft. The graphical model 1800 may include a plurality of graphical objects, such as blocks, that perform functions or operations. In particular, the graphical model 1800 may include an Inport block (FromMotor) 1802, four FiveElement subsystem blocks 1804-1807, i.e., first, second, third and fourth subsystem blocks, and an Outport block (ToClutch) 1808. Each FiveElement subsystem block 1804-1807 may hierarchically represent a plurality of objects, such as a plurality of FlexibleElement objects (not shown).

The user may open other objects of the container 1524, such as one or more of the tests 1528a-c, the interface specification 2000, the design specification 1532, or the design requirements 1534.

Figure 19:
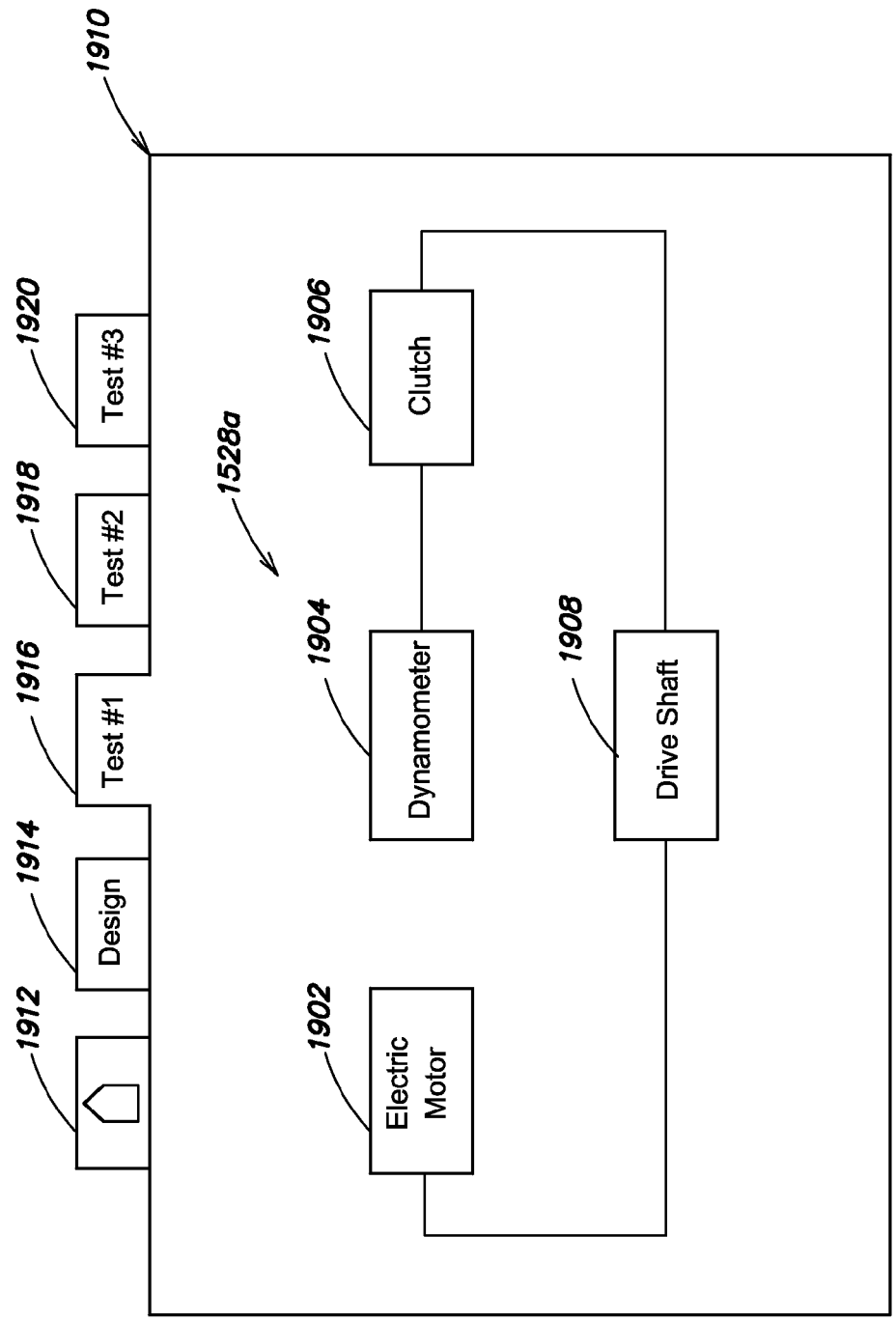
FIG. 19 is an illustration of a test model having executable semantics in accordance with an embodiment of the present invention.

FIG. 19 is a schematic illustration of the first test 1528a, which is implemented as a graphical model, such as a block diagram model. The first test 1528a may be opened by the model editor 1504, and presented on the display 120. The first test 1528a may include a plurality of graphical objects, such as blocks. Specifically, the first test 1528a may include an electric motor block 1902, a dynamometer block 1904, a clutch block 1906 and a model reference block 1908. The model reference block 1908 may provide a reference to the design model 1800 (FIG. 18). The electric motor block 1902 and the clutch block 1906 may be coupled to the model reference block 1908 to provide input to and receive output from the design model 1800 via the model reference block 1908. The first test 1528a is an example of a closed loop test. In a closed loop test, an output of the article being tested, e.g., a design model, is used during simulation to affect one or more inputs of the closed loop test. Alternatively or additionally, an output of the closed loop test may be used during simulation to affect one or more inputs of the article being tested. In a closed loop test, the simulation engine 1506 may consider the closed loop test and design model to be intricately intertwined, e.g., when using a differential algebraic equation (DAE) solver network. Nonetheless, the simulation engine 1506 may be configured to retain the identity of the design model as distinct from the elements of the closed loop test.

The first test 1528a may be opened in a user interface 1910 having a plurality of navigation tabs. In particular, the user interface 1910 may include a home tab 1912, a design tab 1914, a first test tab 1916, a second test tab 1918 and a third test tab 1920. To navigate among the home screen 1700, the design model 1800 and the tests, a user may select a corresponding navigation tab 1912-1920, e.g., using the mouse 118. For example, to return to the graphical model 1800 (FIG. 18), the user may select the design tab 1914. The model canvas on which the graphical model 1800 is presented also may include a series of navigation tabs.

As mentioned, the second test 1528b may be a program or script written textually in a programming language, such as the MATLAB language. It may be opened in an editor, such as the MATLAB editor or another text editor, and changed or modified by the user. The third test 1528c may be a data file or object that contains input data for the design model 1800. The input data may be received and processed by the design model 1800 during execution generating one or more output values. The third test 1528c also may include expected output data values or ranges that may be compared to the actual values generated by the design model 1800 during execution, e.g., simulation. The third test 1528c may be associated with a test model, such as a test harness. The test harness may be configured to load the data file or object, e.g., from a workspace or from a storage location based on a file name, and utilize the information from the loaded data file or object as inputs to the design model. The test harness also may be configured to evaluate outputs of the design model against information from the loaded data file or objects. Other data driven tests, e.g., other data files or objects, may utilize the same test harness to test the design model. The test harness may include built-in data that may be parametrically combined with data from the data file or object loaded by the test harness. In addition, the test harness may be configured to manipulate data from the data file or object, e.g., it may scale or apply other treatments to the data.

In an embodiment, all of the objects of the design project container 1524 are user-editable. That is, the user may open, modify and save any of the design model 1800, the tests 1528, the interface specification 2000, the design specification 1532, the design requirements 1534 and the test requirements 1535. Nonetheless one or more of the objects may be locked from editing. One or more objects, such as the design model 1800, may be locked even from viewing, for example to create a 'black box' test. In a "black box" test, pass/fail results may be presented, even though the user may be blocked from "seeing" inside the black box.

Returning to FIG. 16A, the broker 1516 may analyze the design model 1800 to identify the model's external interface, as indicated at block 1610. For example, the broker 1516 may evaluate an in-memory representation of the design model 1800, and identify the design model's external inputs, outputs, initialization settings, parameters, and control signals, among other interface elements. The initialization settings may specify values, such as default or starting values for states, signals, inputs and/or outputs of the design model. Utilizing this information, the broker 1516 may construct the interface specification 2000, which may also be referred to as an interface definition, for the design model 1800, as indicated at block 1612.

The broker 1516 also may identify the one or more tests 1528 associated with the design model 1800, and analyze each of the tests 1528 to determine a mapping between interface elements of the tests and the interface elements of the design model, as indicated at block 1614. The broker 1516 may include this mapping information in the interface specification 2000, as indicated at block 1616.

FIG. 20 is a schematic illustration of the interface specification 2000. The interface specification 2000 may be opened in an editor, such as a text editor, by selecting the interface specification button 1706 on the home screen 1700. In an embodiment, the interface specification 2000 may be organized as an array, e.g., a table, with a plurality of rows and columns whose intersections define cells for storing information or data. Each row may correspond to a particular interface element, and may store information for that interface element. More specifically, each column may specify a particular category or type of information for the interface elements. For example, a first column 2002 of the interface specification 2000 may store the names of the interface elements at the design model 1800. A second column 2004 may store the names of the interface elements at the first test 1528a. A third column 2006 may store the names of the interface elements at the second test 1528b. A fourth column 2008 may store the names of the interface at of the third test 1528c. The interface specification 2000 may include additional information concerning the interface elements, such as attributes.

For example, the interface specification may include a Data Type column 2010 that stores a data type of the interface element, a Data Dimension column 2012 that stores a data dimension of the interface element, a Complexity column 2014 that stores the complexity of the interface element, a Sampling Mode column 2016 that stores a type of sampling mode of the interface element, a Read/Write column 2018 that stores an indication of whether the interface element is readable, writeable, or readable and writable. For example, in the Simulink modeling environment, an Inport may be read only, an Outport may be write only, and a data store memory (DSM) may be readable and writeable, a Range column 2020 that stores a range of values for the interface element, and a Default Value(s) column 2022 that stores one or more default conditions, if any, for the interface element. A readable and writeable interface element, such as a DSM, may serve as both an input and an output of a design model and/or a test. Other elements that may represent both an input and an output include a pointer that can be dereferenced from or written to.

Groups of rows of the interface specification 2000 may be organized, for example, by type of external interface. In particular, the interface specification 2000 may include a first set of rows 2024 for the external inputs to the design model 1800, a second set of rows 2026 for the external outputs of the design model 1800, a third set of rows 2028 for the initialization settings of the design model 1800 (states and signals), a fourth set of rows 2030 for the model settings/parameters of the design model 1800, and a fifth set of rows 2032 for the design control signals of the design model 1800. It should be understood that the interface specification 2000 may include other types of external interfaces.

As noted, each row of the interface specification 2000 may store information concerning a given interface element. For example, row 2034 may contain information regarding an input to the design model 1800, such as the 'FromMotor' input, which maps to the 'ToShaft' output of the first test, the 'Out1' output of the second test, and the 'Out1' output of the third test. Row 2036 may contain information regarding an output of the design model 1800, such as the 'ToClutch' output, which maps to the 'FromShaft' input of the first test, the 'In1' input of the second test and the 'In1' input of the third test.

It should be understood that the interface specification 2000 may include additional, fewer and/or other interface elements. For example, where the design model supports the inclusion of interface elements, such as Data Store Memory elements, that can represent both an input and an output, the interface specification may not include entries or groups of entries labeled as distinct inputs and outputs. Instead, the interface specification may simply include entries for interface elements, such as readable/writeable interface elements.

In an embodiment, the interface specification 2000 may take other forms besides a tabular form, such as a graphical representation, etc.

Modifying the Interface Specification

Figure 16B:
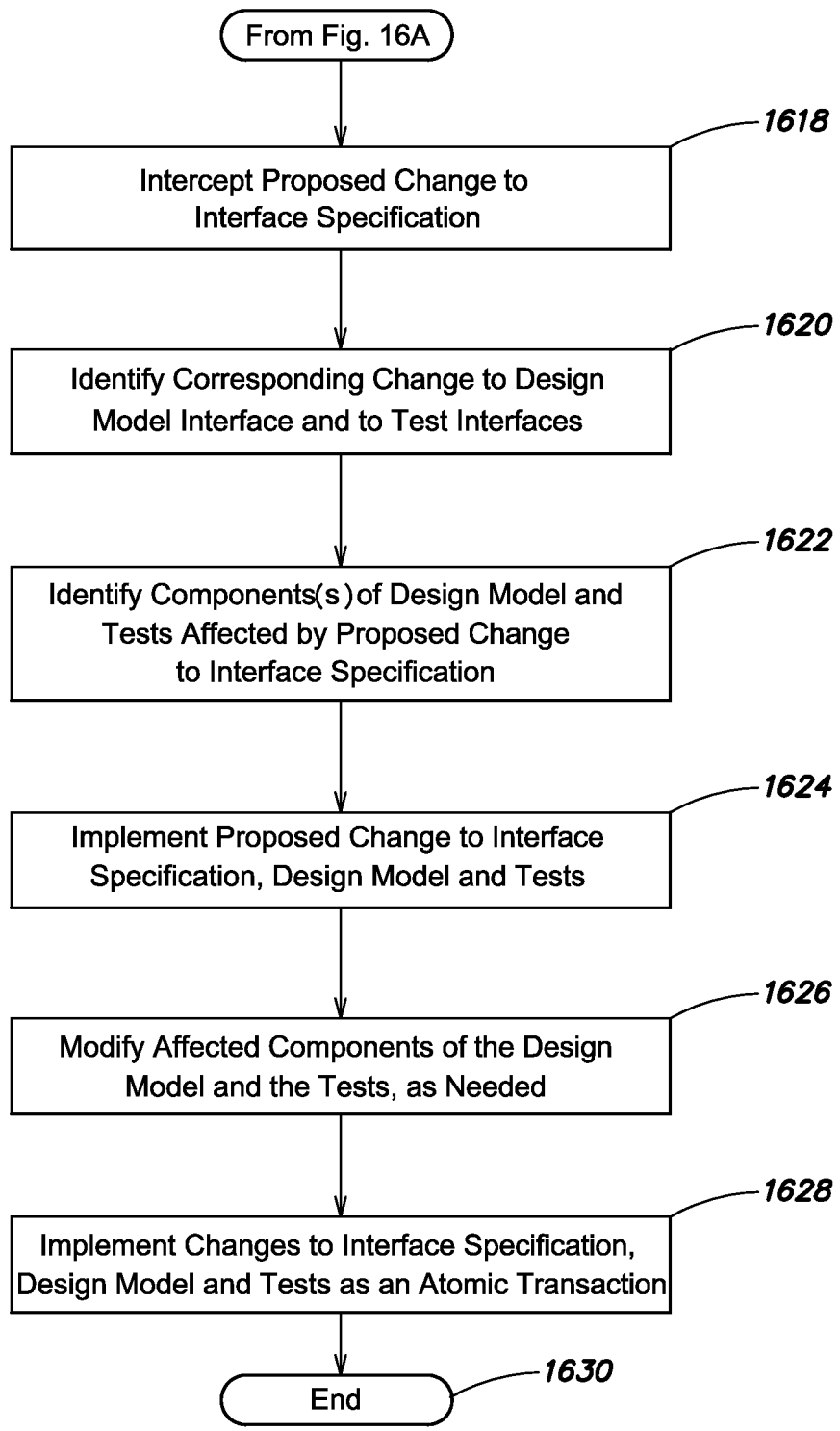

As noted above, the broker 1516 may be configured to intercept proposed changes to the interface of the design model 1800 and of the tests 1528. In addition, the broker 1516 also may intercept a proposed change to the interface specification 2000, as indicated at block 1618 (FIG. 16B). That is, a user may open the interface specification 2000, for example, in a text or other editor, and modify the interface specification 2000. Exemplary changes or modifications include adding, removing or changing an interface element, such as an input, output or initialization setting of the design model 1800. For example, the user may remove an existing row or add a new row to the interface specification 2000 to specify a new input, output or initialization setting of the design model 1800. The user also may enter some information, such as a name and/or one or more attributes, for a new row specifying a new input, output or initialization setting. The broker 1516 may intercept the requested change before it is carried out.

The broker 1516 may examine the proposed change and identify the corresponding changes to the interface of the design model 1800 and to the interfaces of the tests 1528 to keep them consistent with each other, as indicated at block 1620. The broker 1516 may also identify any components of the design model 1800 and the tests 1528 that are affected by the proposed change, as indicated at block 1622. The broker 1516 may then carry out, e.g., implement, the proposed change to the interface specification 2000, and make the corresponding changes to the design model 1800 and the tests 1528, as indicated at block 1624. In addition, the broker 1516 may modify the components of the design model 1800 and the tests 1528 identified as being affected by the proposed change to the interface specification 2000, as indicated at block 1626. The atomic transaction engine 236 may execute the changes to the design model 1800, the tests 1528, and the interface specification 2000 as a single, indivisible operation, such as an atomic transaction, as indicated at block 1628. Processing may then be completed, as indicated by end block 1630.

To the extent the user deletes one or more interface elements from the design model 1800, the interface specification 2000 and/or the tests 1528, the interface broker 1516 may be configured to replace such deleted items with ground or terminator blocks. The interface broker 1516 also may be configured to mark interface elements added to the design model 1800, the interface specification 2000 and/or the tests 1528 as having been 'automatically added'. In this way, the user may be provided with a visual cue identifying new interface elements added to the design model 1800, the interface specification 2000 and/or the tests 1528.

Mapping Generated Data to Create a Data Driven Test

Figure 21A:
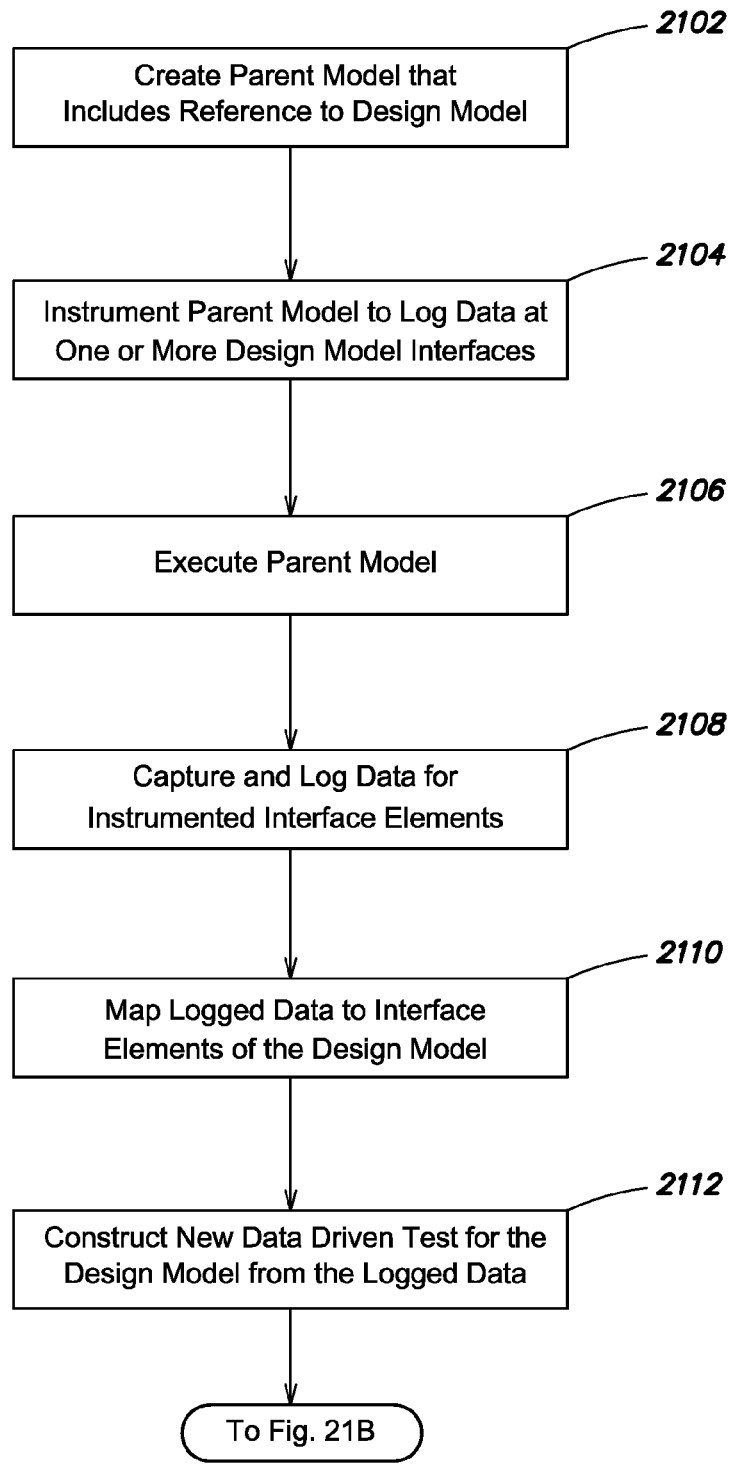
FIGS. 21A and B is a flow diagram of a method in accordance with an embodiment of the present invention.

FIGS. 21A and B is a flow diagram of a method for generating a data driven test for a design model in accordance with an embodiment of the present invention. A top or parent model may be created that includes the design model 1800, as indicated at block 2102. For example, the parent model may include a model reference block that references the design model 1800. The parent model may be a test model for the design model 1800. The parent model may be instrumented, as indicated at block 2104. In particular, at least some and preferably all, of the interface elements of the design model 1800, e.g., the model reference block that references the design model 1800, may be instrumented in order to log the data, such as signal traces, at those interface elements during simulation of the parent model. Suitable mechanisms for logging signals in a graphical modeling environment include enabling the 'DataLogging' property of a signal using the Signal Properties dialog box in the Simulink modeling environment from The MathWorks, Inc., or the Model Explorer tool also from The MathWorks, Inc. Once the desired interface elements have been enabled for data logging, the parent model may be executed, e.g., simulated, as indicated at block 2106. During execution of the parent model, data values, such as signal traces, generated at the logged interface elements, may be recorded, e.g., stored, as indicated at block 2108. The logged data may be stored in one or more data objects, which may be saved to a memory.

Figure 21B:
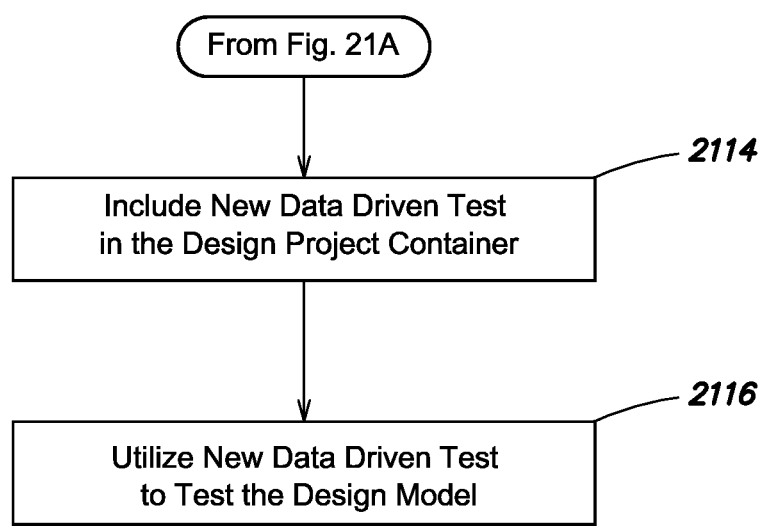

The broker 1516 may map the logged data to respective interface elements of the design model 1800, as indicated at block 2110. In particular, the broker 1516 may link the data logged for particular signals to corresponding interface elements of the design model 1800. The mapping or linking of logged data to interface elements may be stored in the interface specification 2000. That is, the broker 1516 may automatically construct a new data driven test for the design model 1800, and store the data driven test in the interface specification 2000, as indicated at block 2112. For example, the broker 1516 may save the logged data (or pointers to the logged data) in the interface specification 2000. The broker 1516 also may include the new data driven test in the design project container 1524, as indicated at block 2114 (FIG. 21B).

Thereafter, a user may select the new data driven test, and utilize the data stored therein to test the design model 1800, as indicated at block 2116. Because the interface specification 2000 includes a mapping of the generated data, such as signal traces, to respective interface elements of the design model 1800, the user need not manually establish such a mapping. A test harness, such as an existing test harness, may be used to test the design model utilizing the data stored in the new data driven test. For example, a user may create a plurality of data driven tests all which may use the same test harness when the data from the data driven tests is used to test the design model.

In an alternative embodiment, test data for a data driven test may be generated from a model that does not include the design model. For example, a model having a prior version of the design model may be used, or a model having a different sub-model may be used.

Generating Default Actions

Figure 22:
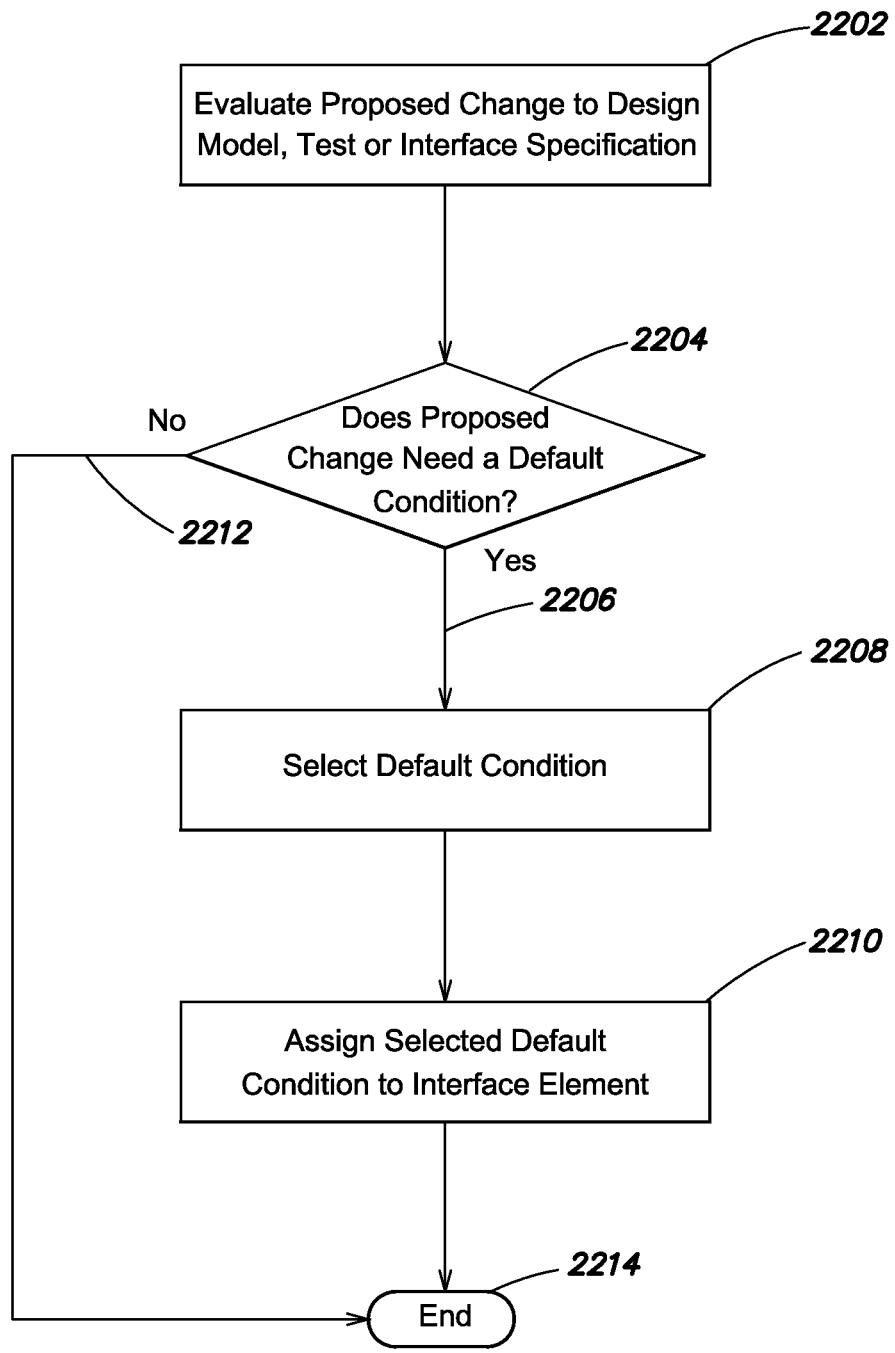
FIG. 22 is a flow diagram of a method in accordance with an embodiment of the present invention.

FIG. 22 is a flow diagram for generating default conditions for new interface elements. The default condition generator 1522 may evaluate the change being proposed to the design model's interface, the interface of a test or to the interface specification 2000, as indicated at block 2202. The default condition generator 1522 may determine whether the proposed change may need a default condition associated with it, as indicated at decision block 2204. For example, the default condition generator 1522 may determine the type of change being proposed, and whether the type of change may need a default condition. For example, if the proposed change is the addition of a new input to the design model 1800, the default condition generator 1522 may determine that a default condition, such as a default value, may need to be associated with the new input. If the proposed change is the addition of a new test for an output of the design model 1800, the default condition generator 1522 again may determine that a default condition should be associated with the new output test.

The default condition generator 1522 may select default values that prevent the design model from erring out during execution. The selected default values may cause one or more warning messages to be displayed, such as status warning messages informing the user that default values are being used. In an embodiment, the default condition generator 1522 may select or use a particular default condition or value depending on the data type of the interface element. For example, for a numeric data type, the default condition generator 1522 may use zero as the default condition. For a fixed-point type, the default condition generator 1522 may use a ground value as the default condition. For a Boolean type, the default condition generator 1522 may use False as a default condition. As an example, a design model may include a 'system status' input, whose value may be 'OK' or 'Failed'. The default condition may be 'OK', and the 'system status' input may only need to be set to 'Failed' when the user wants to test a failure mode.

A ground block or other element may be used to output a signal with a ground value. A ground value may be zero (0) when the output data type of the ground block, as disposed within a given model, can represent zero (0) exactly. When the output data type cannot represent zero (0) exactly, the ground value may be a non-zero value that is a closest possible value to zero. This behavior may apply only to fixed-point data types with non-zero bias. An example of a fixed-point data type with non-zero bias is given by 'fixdt(0, 8, 1, 1)', which identifies an unsigned 8-bit data type with a slope of one (1) and a bias of one (1). If the output of the ground block is an enumeration data type, the ground value may be the default value of the enumeration, even where the enumeration can represent zero (0). If the enumerated data type does not have a default value, the ground value may be the first enumeration value in the type definition. An enumeration data type may refer to a user-defined data type whose values belong to a predefined set of symbols or names, and the symbols or names may represent a single type of value. An enumerated value may include a name and an underlying value, such as a numeric value.

The default condition generator 1522 may be configured with the identification of a default test harness for a particular design model. In this case, if a user selects a data driven test, but not a test harness, the default condition generator 1522 may utilize the default test harness.

If the default condition generator 1522 determines that a default condition should be assigned to the proposed change, it automatically selects a default condition for the proposed change, as indicated by Yes arrow 2206 leading to block 2208. The default condition generator 1522 may also assign the selected default condition to the corresponding interface element, as indicated at block 2210. For example, the default condition generator 1522 may store the selected default condition (or a pointer thereto) in the interface specification 2000, e.g., at the default condition column 2022.

In an embodiment, the default condition generator 1522 may be configured to utilize a default value as the default condition depending on the type of proposed change being made. For example, suppose a user accesses the interface specification 2000 and adds a new input to the design model 1800. The default condition generator 1522 may be configured to assign a default value of '0' or a ground value to this new input, because such a value is unlikely to cause an error during simulation of the design model 1800. If the user adds a new output test to a test 1528, the default condition generator 1522 may be configured to assign a default test condition of 'Pass' to this new output test, because such a value is unlikely to cause an error when the design model 1800 is tested using the test 1528.

The default condition generator 1522 may alternatively or additionally be further configured to utilize information in the design specification 1532, the design requirements 1534 and/or the test requirements 1535 to select the default condition. For example, the design specification 1532 may indicate that inputs to the design model are to receive electrical signals at 400 Hz and 5 volts. In this case, the default condition generator 1522 may assign a default condition value to a new input of 400 Hz and 5 volts. Similarly, the default condition generator 1522 also may be configured to use information generated by the design verifier 1544 to select the default condition. For example, a callback function, object or method may be registered for an interface element. The callback function may call a function and ask for data for a particular time or a range of times, such as (Gen400hz5VoltSineWave(t1,t2).

In yet another embodiment, the user may specify one or more default values to be assigned by the default condition generator 1522. For example, the user may annotate interface elements of the design model 1800 with information concerning those interface elements. The default condition generator 1522 may access these annotations to select an appropriate default condition. For example, the default condition generator 1522 may inspect the interface element for Frequency, Voltage and Phase Offset, and determine that the interface element specifies: 400 (units: Hertz); 5 (units: Volts); and 0.25 (units: cycles). The user also may specify one or more rules to be applied by the default condition generator 1522 when selecting a particular default condition value.

Returning to decision block 2204, if the proposed change does not need a default condition, processing may end, as indicated by No arrow 2212 leading to End block 2214.

As noted, the default condition generator 1522 may be configured to supply nominal values for new interface elements so that testing of the design model may proceed without erring out. The default actions or values utilized by the default condition generator 1522 may be user-settable. For example, the creator of the design model may include comments with the model that specify or provide indications of default actions or values to be used for new interface elements.

Component Modeling/Incremental Loading

Figure 23:
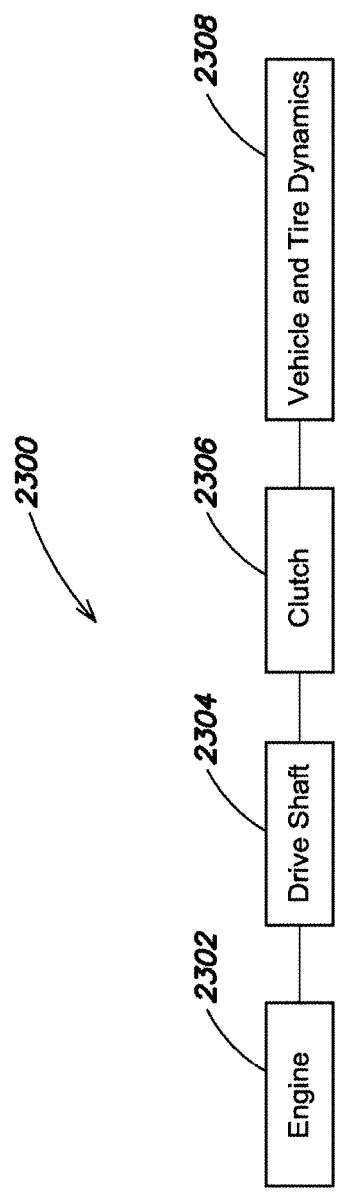
FIG. 23 is an illustration of a parent graphical model having executable semantics in accordance with an embodiment of the present invention.

The design model 1800 of the design project container 1524 may be included within a higher-level graphical model having executable semantics. FIG. 23 is a schematic illustration of a parent graphical model 2300 that includes a plurality of components. In particular, the parent model 2300 may include an engine component 2302, a drive shaft component 2304, a clutch component 2306, and a vehicle and tire dynamics component 2308. The components 2302-2308 may be model reference blocks that each reference other models. For example, the engine component 2302, which is coupled to the drive shaft component 2304, may reference a model of an engine, such as a gasoline or diesel powered engine. The drive shaft component 2304, which is coupled to the clutch component 2306, may reference the design model 1800 (FIG. 18), which models a car's drive shaft. The clutch component 2306, which is coupled to the vehicle and tire dynamics component 2308, may reference a model of a clutch. The vehicle and tire dynamics component 2308 may reference a model of the dynamics of a car. These other models may be time-based and/or data/control-based graphical models, state diagrams, textual models, or combinations thereof.

Each of the components 2302-2308 may have been created by different teams, e.g., different groups of designers and engineers. Nonetheless, all of the components 2302-2308 of the parent model 2300 are intended to work together to model a system, e.g., a car.

The drive shaft component 2304 may include a reference, such as a dynamic link, to the design model 1800 of the design project container 1524. The drive shaft component 2304 may not include references to the other objects of the design project container 1524. In this way, when the parent model 2300 is opened, the model editor 1504 only loads the design model 1800 from the design project container 1524 into memory. The model editor 1504 does not load any of the other objects from the design project container 1524 into memory, such as the tests 1528, the interface specification 2000, the design specification 1532, the design requirements 1534 or the test requirements 1535. This partial loading of objects may be referred to as incremental loading.

Maintaining Separation Among Design, Test and Other Objects

In an embodiment, the container manager 1523 is configured to maintain meta data for the objects stored in a container, such as the design project container 1524. The meta data may include information such as the type of object, e.g., design model, test, etc., revision number, the date the object was created, the date the object was last modified, the date the object was last accessed, statistics on the object, etc.

In an embodiment, the container manager 1523 may be configured to keep the design model 1800 separate from the other objects stored in the container 1524. Furthermore, the container manager 1523 may be configured such that changes or edits to the tests 1528, the design specification 1532, or the design requirements 1534 may not cause any changes to be made to the design model 1800. To prove that the design model 1800 has not been changed, the meta data created for the design model 1800 by the container manager 1523 may be accessed and checked, e.g., by a project manager. In addition, the difference engine 1540 may be employed to compare the current design model 1800 with an earlier version to again prove that no changes have been made to the design model 1800.

Distinguishing Between Design Requirements and Test Requirements

Figure 24:
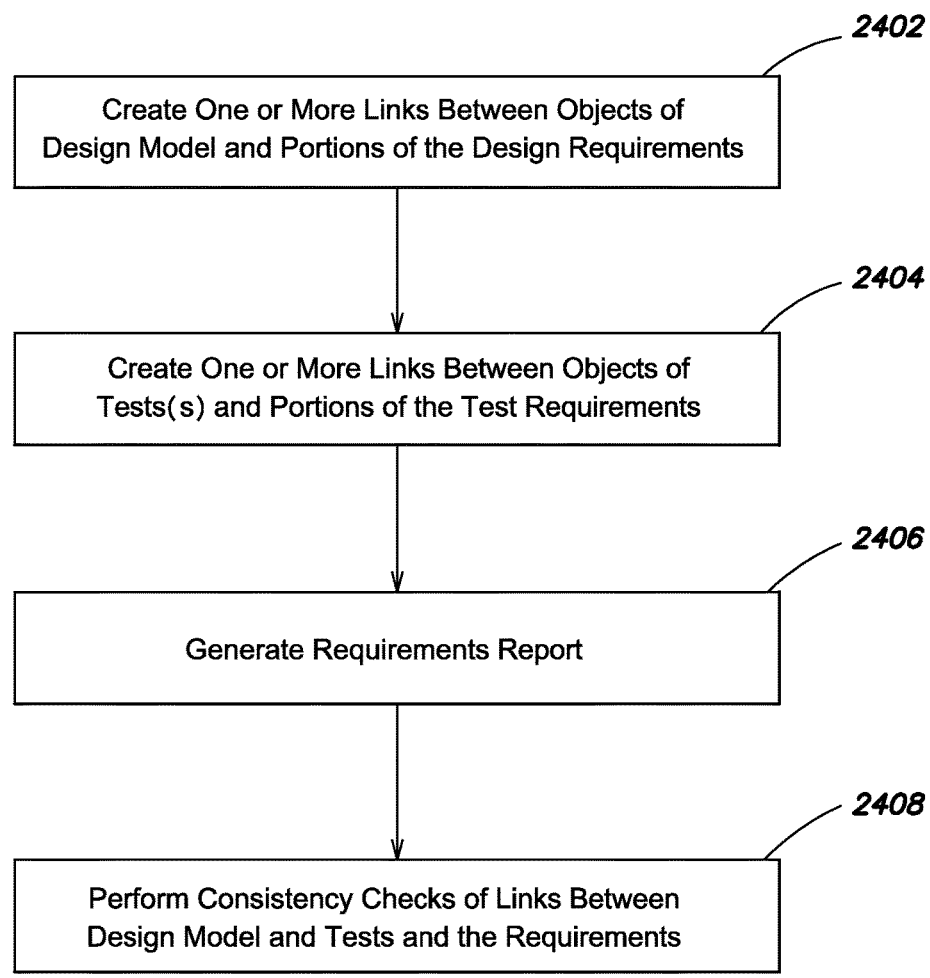
FIG. 24 is a flow diagram of a method in accordance with an embodiment of the present invention.

FIG. 24 is a flow diagram of a method of operation of the requirements manager 1525 in accordance with an embodiment of the present invention. The requirements manager 1525 may be configured to create links between selected objects of the design model 1800 and selected portions of the design requirements 1534, as indicated at block 2402. The requirements manager 1525 may also create links between selected objects of one or more of the tests 1528, such as the test model 1528*a*, and selected portions of the test requirements 1535, as indicated at block 2404. In particular, the UI engine 1502 may create a Requirements Management Interface for display, e.g., on the screen 120. The user may specify one or more links through the Requirements Management Interface. The links may be references that point to textual or other entries in the design requirements 1534 and/or the test requirements 1535 documents. More specifically, a requirement object or bookmark in the design requirements 1534 and/or the test requirements 1535 may be linked using a context menu to one or more objects of the design model 1800 or the test model 1528*a*.

The requirements manager 1525 may also generate a requirements report, as indicated at block 2406. The requirements report may indicate which design requirements are satisfied by objects of the design model 1800, and which test requirements are satisfied by objects of the test model 1528*a*. The links, moreover, may enable bi-directional traceability. Accordingly, the design model 1800, the interface specification 2000 and the tests 1528 may be audited to confirm that all design requirements are implemented somewhere in the design model 1800, e.g., there are no missing design requirements, and that all test requirements are being tested by the tests 1528, e.g., there are no untested requirements.

The requirements manager 1525 may also run one or more consistency checks to identify removed or modified requirements, as indicated at block 2408.

Because the container manager 1523 maintains a separation among the design model 1800 and the tests 1528, a user can easily determine whether a particular requirement is linked to the design model 1800, and thus represents a design requirement, or is linked to a test 1528, and thus represents a test requirement.

Generating a 'Life Support' Test

In an embodiment, the automatic test builder 1542 may be configured to construct a minimal test for the design model 1800. The minimal test may be a test model or a test harness having the fewest elements that still permits the design model 1800 to be tested without erring out or producing other failures. The automatic test builder 1542 may utilize the information in the interface specification 2000 to construct the minimal test. In an embodiment, the automatic test builder 1542 may not consider the design model 1800 at all when constructing the minimal test. For example, the automatic test builder 1542 may create an output for each design model input listed in the interface specification 2000. The automatic test builder 1542 may create an input for each design model output listed in the interface specification 2000. Additionally, the automatic test builder 1542 may utilize the attribute information stored in the interface specification when constructing the minimal test harness. The automatic test builder 1542 may alternatively or additionally be further configured to utilize information in the design specification 1532, the design requirements 1534 and/or the test requirements 1535 to construct the minimal test.

The foregoing description of embodiments is intended to provide illustration and description, but is not intended to be exhaustive or to limit the invention to the precise form disclosed. Modifications and variations are possible in light of the above teachings or may be acquired from a practice of the invention. For example, while a series of acts has been described above with respect to the flow diagrams, the order of the acts may be modified in other implementations. Further, non-dependent acts may be performed in parallel. Also, the term "user", as used herein, is intended to be broadly interpreted to include, for example, a computer or data processing system (e.g., system 100) or a user of a computer or data processing system, unless otherwise stated.

Further, certain embodiments of the invention may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 100. The computer-executable instructions may include instructions that implement one or more embodiments of the invention. The tangible non-transitory computer-readable storage media may be volatile or non-volatile and may include, for example, flash memories, dynamic memories, removable disks, and non-removable disks.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present invention. It will be apparent, however, that other variations and modifications may be made to the described embodiments, with the attainment of some or all of their advantages. Therefore, it is the object of the appended claims to cover all such variations and modifications as come within the true spirit and scope of the invention.

What is claimed is:

1. A method comprising:
   accessing, from a memory, an executable design model, the design model including a plurality of design model external interface elements, the plurality of design model external interface elements including:
   first graphical objects for receiving input data into the design model, during execution of the design model
   second graphical objects for providing output data computed by the design model, during the execution of the design model, wherein the design model, during the execution, implements first functionality that simulates operation of a system;
   associating an executable test with the design model, the test including a plurality of test interface elements;
   executing the test, wherein, during the executing the test, the plurality of test interface elements:
   provide first information to the first graphical objects of the design model and
   receive second information from the second graphical objects of the design model, and further wherein the test, during the executing the test, implements second functionality including testing at least part of the design model, and the second functionality implemented by the test differs from the first functionality implemented by the design model;
   generating, by a processor, an interface specification, the interface specification including a mapping of the first graphical objects or the second graphical objects of the design model to corresponding one or more of the plurality of test interface elements of the test;
   detecting, by the processor, a modification to the interface specification;
   automatically modifying, by the processor, the design model to conform to the modification to the interface specification based on the mapping included in the interface specification; and
   automatically modifying, by the processor, the test to conform to the modification to the interface specification based on the mapping included in the interface specification,
   to maintain consistency among the test and the design model.

2. The method of claim 1 wherein a plurality of executable tests are associated with the design model, the method further comprising:
   automatically modifying the plurality of tests to conform to the modification to the interface specification.

3. The method of claim 1 wherein the modification to the interface specification, the automatically modifying to the design model, and the automatically modifying to the test are performed as part of a single transaction.

4. The method of claim 1 further comprising:
   analyzing the test to identify respective test interface elements of the test that correspond to the plurality of design model external interface elements of the design model.

5. The method of claim 1 wherein the plurality of design model external interface elements of the design model include at least one:
   initialization settings;

model-level settings;
model-level parameters; or
control signals.

6. The method of claim 1 further comprising:
generating a displayable form of the interface specification; and
presenting the displayable form of the interface specification to a user.

7. The method of claim 6 wherein
the displayable form of the interface specification is user-editable; and
the modification to the interface specification is received through the displayable form of the interface specification presented to the user.

8. The method of claim 1 further comprising:
automatically determining a need for a default condition for the design model as modified to conform to the modification to the interface specification;
selecting a given default condition; and
assigning the given default condition to the design model as modified to conform to the modification to the interface specification.

9. The method of claim 8 wherein the given default condition permits successful execution of the design model following the automatically modifying the design model.

10. The method of claim 9 wherein
the automatically modifying the design model adds a new first graphical object, and
the given default condition is a ground value for the new first graphical object.

11. A method comprising:
accessing, from a memory, an executable test model, the test model including a reference to a sub-model, the sub-model including a plurality of external interface elements, the plurality of external interface elements including:
first graphical objects for receiving input data into the reference to the sub-model; and
second graphical objects for providing output data to the reference to the sub-model;
instrumenting, by a processor coupled to the memory, the test model to log data exchanged with the reference to the sub-model through the first graphical objects and the second graphical objects;
executing the test model;
capturing, by the processor, the data exchanged with the reference to the sub-model through the first graphical objects and the second graphical objects during one or more executions of the test model; and
automatically generating, by the processor, a data driven test for a design model utilizing the data, the data driven test including a mapping of the data to the first graphical objects and the second graphical objects of the sub-model, wherein
the sub-model, during the executing the test model, implements first functionality that simulates operation of a system, and
the test model, during the executing the test model, implements second functionality including testing at least part of the sub-model, and the second functionality implemented by the test model differs from the first functionality implemented by the sub-model.

12. The method of claim 11 wherein
the sub-model represents a version of the design model.

13. The method of claim 11 wherein
the reference to the sub-model is a model reference block of the design model.

14. The method of claim 11 wherein
the test model and the sub-model are graphical models.

15. The method of claim 11 wherein the data includes a plurality of signal traces, the method further comprising:
mapping, by the processor, the signal traces of the data to the first graphical objects and the second graphical objects of the sub-model.

16. The method of claim 15 wherein at least some of the first graphical objects and at least some of the second graphical objects of the sub-model are coupled to respective interface elements of the test model, the method further comprising:
accessing, by the processor, an interface specification that stores information concerning the plurality of external interface elements of the sub-model and the interface elements of the test model; and
utilizing, by the processor, the information stored in the interface specification to perform the mapping.

17. The method of claim 11 wherein
the design model generates results during execution of the design model, and
the data driven test includes
input data for processing by the design model, and
output data for comparison to the results generated during the execution of the design model.

18. A non-transitory computer-readable medium comprising program instructions, the program instructions when executed by a processing element operable to:
access, from a memory, an executable design model, the design model including a first plurality of external interface elements, the first plurality of external interface elements including:
first graphical objects for receiving input data into the design model, during execution of the design model; and
second graphical objects for providing output data computed by the design model, during the execution of the design model, wherein the design model, during the execution, implements first functionality that simulates operation of a system;
associate an executable test with the design model, the test including a second plurality of interface elements;
execute the test, wherein, during the executing the test, the second plurality of interface elements:
provide first information to the first graphical objects of the design model and
receive second information from the second graphical objects of the design model, and further wherein the test, during the executing the test, implements second functionality including testing at least part of the design model, and the second functionality implemented by the test differs from the first functionality implemented by the design model;
generate an interface specification, the interface specification including a mapping of one or more of the first graphical objects or the second graphical objects of the design model to corresponding one or more of the second plurality of interface elements of the test;
detect a modification to one of
the first graphical objects or the second graphical objects of the design model,
the second plurality of interface elements of the test, or
the interface specification;
if the modification is to one of the first graphical objects or to one of the second graphical objects of the design model, automatically modify the interface specification and one or more of the second plurality of interface elements of the test to conform to the modification to the one of the graphical objects or to the one of the second graphical objects of the design model, based on the mapping included in the interface specification;

if the modification is to one of the second plurality of interface elements of the test, automatically modify the interface specification and one or more of the first graphical objects or the second graphical objects of the design model to conform to the modification to the one of the second plurality of interface elements of the test, based on the mapping included in the interface specification; and if the modification is to the interface specification, automatically modify one or more of the first graphical objects or one or more of the second graphical objects of the design model and one or more of the second plurality of interface elements of the test to conform to the modification to the interface specification, based on the mapping included in the interface specification, to maintain consistency among the design model and the test.

19. The non-transitory computer readable medium of claim 18 further comprising program instructions to:

automatically determine a need for a default condition for the modification to the one of the first graphical objects or the one of the second graphical objects of the design model;

select a given default condition; and assign the given default condition to the one of the first graphical objects or the one of the second graphical objects of the design model.

20. The non-transitory computer readable medium of claim 19 wherein the given default condition is a ground value.

21. An apparatus comprising:

a memory configured to store a container, the container storing an executable design model, the design model including a first plurality of external interface elements, the first plurality of external interface elements including:

first graphical objects for receiving input data into the design model, during execution of the design model; and second graphical objects for providing output data computed by the design model, during the execution of the design model, wherein the design model, during the execution, implements first functionality that simulates operation of a system, an executable test associated with the design model, the test including a second plurality of interface elements, the second plurality of interface elements, during execution of the test, providing first information to the first graphical objects of the design model and receiving second information from the second graphical objects of the design model, and an interface specification that includes a mapping between one or more of the first graphical objects or one or more of the second graphical objects of the design model to corresponding one or more of the second plurality of interface elements of the test; and a processor coupled to the memory, the processor configured to execute the test, wherein the test, during the executing the test, implements second functionality including testing at least part of the design model, and the second functionality implemented by the test differs from the first functionality implemented by the design model;

detect a modification to the interface specification;

automatically modify the design model to conform to the modification to the interface specification based on the mapping included in the interface specification; and automatically modify the test to conform to the modification to the interface specification based on the mapping included in the interface specification, to maintain consistency among the test and the design model.

22. The apparatus of claim 21 wherein the first plurality of external interface elements includes at least one readable or writeable interface element.

23. The apparatus of claim 22 wherein the at least one readable or writeable interface element is either a data store memory or a pointer configured to be at least one of dereferenced or written to.

* * * * *

UNITED STATES PATENT AND TRADEMARK OFFICE
CERTIFICATE OF CORRECTION

PATENT NO. : 10,360,310 B2
APPLICATION NO. : 13/838344
DATED : July 23, 2019
INVENTOR(S) : Robert O. Aberg Page 1 of 1

It is certified that error appears in the above-identified patent and that said Letters Patent is hereby corrected as shown below:

In the Claims
Claim 3:
Column 32, Lines 56-57 reads:
"interface specification, the automatically modifying to the design model, and the automatically modifying to the test"
Should read:
--interface specification, the automatically modifying the design model, and the automatically modifying the test--

Signed and Sealed this
Nineteenth Day of May, 2020

Andrei Iancu
*Director of the United States Patent and Trademark Office*